US008924636B2

(12) United States Patent
Hirao et al.

(10) Patent No.: US 8,924,636 B2
(45) Date of Patent: Dec. 30, 2014

(54) MANAGEMENT INFORMATION GENERATING METHOD, LOGICAL BLOCK CONSTRUCTING METHOD, AND SEMICONDUCTOR MEMORY DEVICE

(75) Inventors: Takashi Hirao, Tokyo (JP); Hirokuni Yano, Tokyo (JP); Aurelien Nam Phong Tran, Kanagawa (JP); Mitsunori Tadokoro, Kanagawa (JP); Hiroki Matsudaira, Kanagawa (JP); Tatsuya Sumiyoshi, Kanagawa (JP); Yoshimi Niisato, Kanagawa (JP); Kenji Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 174 days.

(21) Appl. No.: 13/609,991

(22) Filed: Sep. 11, 2012

(65) Prior Publication Data

US 2013/0227246 A1  Aug. 29, 2013

(30) Foreign Application Priority Data

Feb. 23, 2012 (JP) ................................. 2012-037949
Mar. 23, 2012 (JP) ................................. 2012-067981
Mar. 26, 2012 (JP) ................................. 2012-068829
Mar. 26, 2012 (JP) ................................. 2012-068974

(51) Int. Cl.
*G06F 12/10* (2006.01)
*G06F 12/02* (2006.01)

(52) U.S. Cl.
CPC .......... *G06F 12/0246* (2013.01); *G06F 12/109* (2013.01); *G06F 12/1009* (2013.01); *G06F 12/1036* (2013.01)
USPC .... 711/103; 711/206; 711/209; 711/E12.068; 711/112

(58) Field of Classification Search
CPC .............. G06F 12/109; G06F 12/1036; G06F 12/1009; G06F 12/0246; G06F 11/1441; G11C 29/00

USPC ................... 711/103, 112, 206, 209, E12.068
See application file for complete search history.

(56) References Cited

U.S. PATENT DOCUMENTS

| 7,039,781 | B2 | 5/2006 | Iwata et al. |
| 7,054,991 | B2 | 5/2006 | Tanaka et al. |

(Continued)

FOREIGN PATENT DOCUMENTS

| EP | 002278471 A1 * | 1/2011 |
| JP | 11-110283 | 4/1999 |

(Continued)

OTHER PUBLICATIONS

U.S. Appl. No. 13/571,034, filed Aug. 9, 2012, Yano et al.

(Continued)

*Primary Examiner* — Pierre-Michel Bataille
(74) *Attorney, Agent, or Firm* — Oblon, Spivak, McClelland, Maier & Neustadt, L.L.P.

(57) ABSTRACT

A management information generating method wherein logical and physical block addresses (BAs) of continuous addresses are associated with each other in the BA translation table. When a logical block is constructed, a value is set for a maximum number of allowable defective physical blocks. A logical block having fewer defects than the set number is set usable, and a logical block having more defects than the set number is set unusable. System logical block construction is performed to preferentially select physical blocks from a plane list including a large number of usable blocks to equalize the number of usable blocks in each plane list. It is determined whether the number of free blocks is insufficient on the basis of a first management unit and whether the storage area for the indicated capacity can be reserved on the basis of the management unit different from the first unit.

20 Claims, 30 Drawing Sheets

(56) References Cited

U.S. PATENT DOCUMENTS

| | | |
|---|---|---|
| 7,506,098 B2 * | 3/2009 | Arcedera et al. ............. 711/103 |
| 7,949,910 B2 | 5/2011 | Kanno et al. |
| 7,953,920 B2 | 5/2011 | Yano et al. |
| 7,958,411 B2 | 6/2011 | Kanno et al. |
| 7,962,688 B2 | 6/2011 | Yano et al. |
| 8,015,347 B2 | 9/2011 | Kitsunai et al. |
| 8,060,797 B2 | 11/2011 | Hida et al. |
| 8,065,470 B2 | 11/2011 | Yano et al. |
| 8,065,471 B2 | 11/2011 | Yano et al. |
| 8,117,381 B2 * | 2/2012 | Gonzalez et al. ............. 711/103 |
| 8,219,861 B2 | 7/2012 | Hida et al. |
| 8,266,396 B2 | 9/2012 | Yano et al. |
| 8,327,065 B2 | 12/2012 | Yano et al. |
| 8,443,136 B2 * | 5/2013 | Frost et al. ............. 711/103 |
| 2005/0041553 A1 | 2/2005 | Aizawa |
| 2006/0161724 A1 | 7/2006 | Bennett et al. |
| 2006/0161728 A1 | 7/2006 | Bennett et al. |
| 2007/0047305 A1 * | 3/2007 | Conley ............. 365/185.05 |
| 2008/0091872 A1 | 4/2008 | Bennett et al. |
| 2009/0125699 A1 * | 5/2009 | Beadnell et al. ............. 711/173 |
| 2009/0132620 A1 | 5/2009 | Arakawa |
| 2009/0265508 A1 | 10/2009 | Bennett et al. |
| 2010/0161885 A1 | 6/2010 | Kanno et al. |
| 2010/0169549 A1 | 7/2010 | Yano et al. |
| 2010/0169551 A1 | 7/2010 | Yano et al. |
| 2010/0223424 A1 | 9/2010 | Kitsunai et al. |
| 2010/0325343 A1 | 12/2010 | Takashima |
| 2011/0022784 A1 | 1/2011 | Yano et al. |
| 2011/0173380 A1 | 7/2011 | Yano et al. |
| 2011/0219177 A1 | 9/2011 | Kanno et al. |
| 2011/0238899 A1 | 9/2011 | Yano et al. |
| 2011/0264859 A1 | 10/2011 | Yano et al. |
| 2011/0314204 A1 | 12/2011 | Ootsuka et al. |
| 2012/0033496 A1 | 2/2012 | Yano et al. |
| 2012/0159046 A1 | 6/2012 | Norimatsu et al. |
| 2012/0159050 A1 | 6/2012 | Yano et al. |
| 2012/0159058 A1 | 6/2012 | Yonezawa et al. |
| 2012/0159244 A1 | 6/2012 | Hirao et al. |
| 2012/0221776 A1 | 8/2012 | Yoshihashi et al. |
| 2012/0239992 A1 | 9/2012 | Hida et al. |
| 2013/0262748 A1 * | 10/2013 | Chang ............. 711/103 |

FOREIGN PATENT DOCUMENTS

| | | |
|---|---|---|
| JP | 2003-44351 | 2/2003 |
| JP | 2005-56394 | 3/2005 |
| JP | 2005-301885 | 10/2005 |
| JP | 2007-193883 | 8/2007 |
| JP | 2007-199905 | 8/2007 |
| JP | 2007-310637 | 11/2007 |
| JP | 2008-529130 | 7/2008 |
| JP | 2008-276371 | 11/2008 |
| JP | 2009-110053 | 5/2009 |
| JP | 2009-205689 | 9/2009 |
| JP | 2009-211225 | 9/2009 |
| JP | 2009-211232 | 9/2009 |
| JP | 2009-266125 | 11/2009 |
| JP | 2010-176702 | 8/2010 |
| JP | 2011-180831 | 9/2011 |
| WO | WO 2012/081730 A1 | 6/2012 |
| WO | WO 2012/081731 A1 | 6/2012 |
| WO | WO 2012158514 A1 * | 11/2012 |

OTHER PUBLICATIONS

U.S. Appl. No. 13/599,087, filed Aug. 30, 2012, Yonezawa et al.
U.S. Appl. No. 13/616,466, filed Sep. 14, 2012, Kato et al.
Japanese Office Action issued Jun. 17, 2104, in Japan Patent Application No. 2012-037949 (with English translation ).
Office Action issued Jun. 17, 2014 in Japanese Patent Application No. 2012-037949 (with English translation).

* cited by examiner

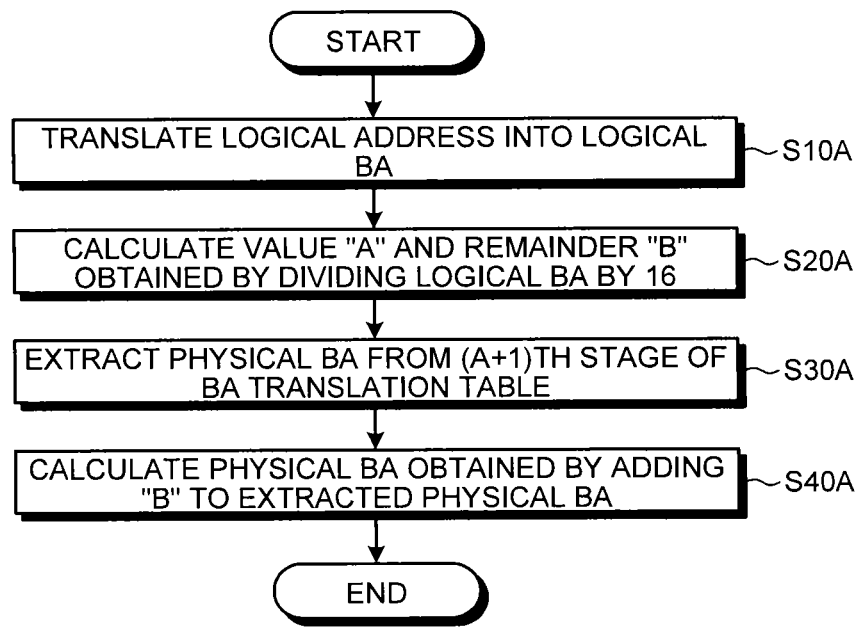

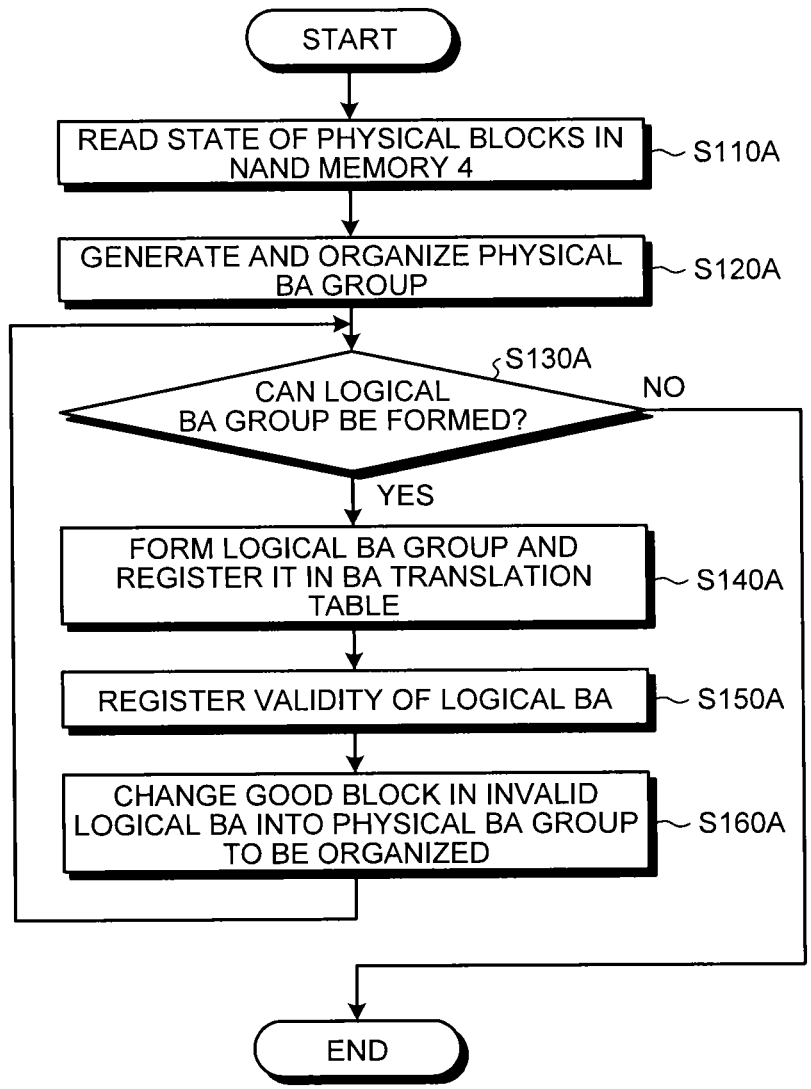

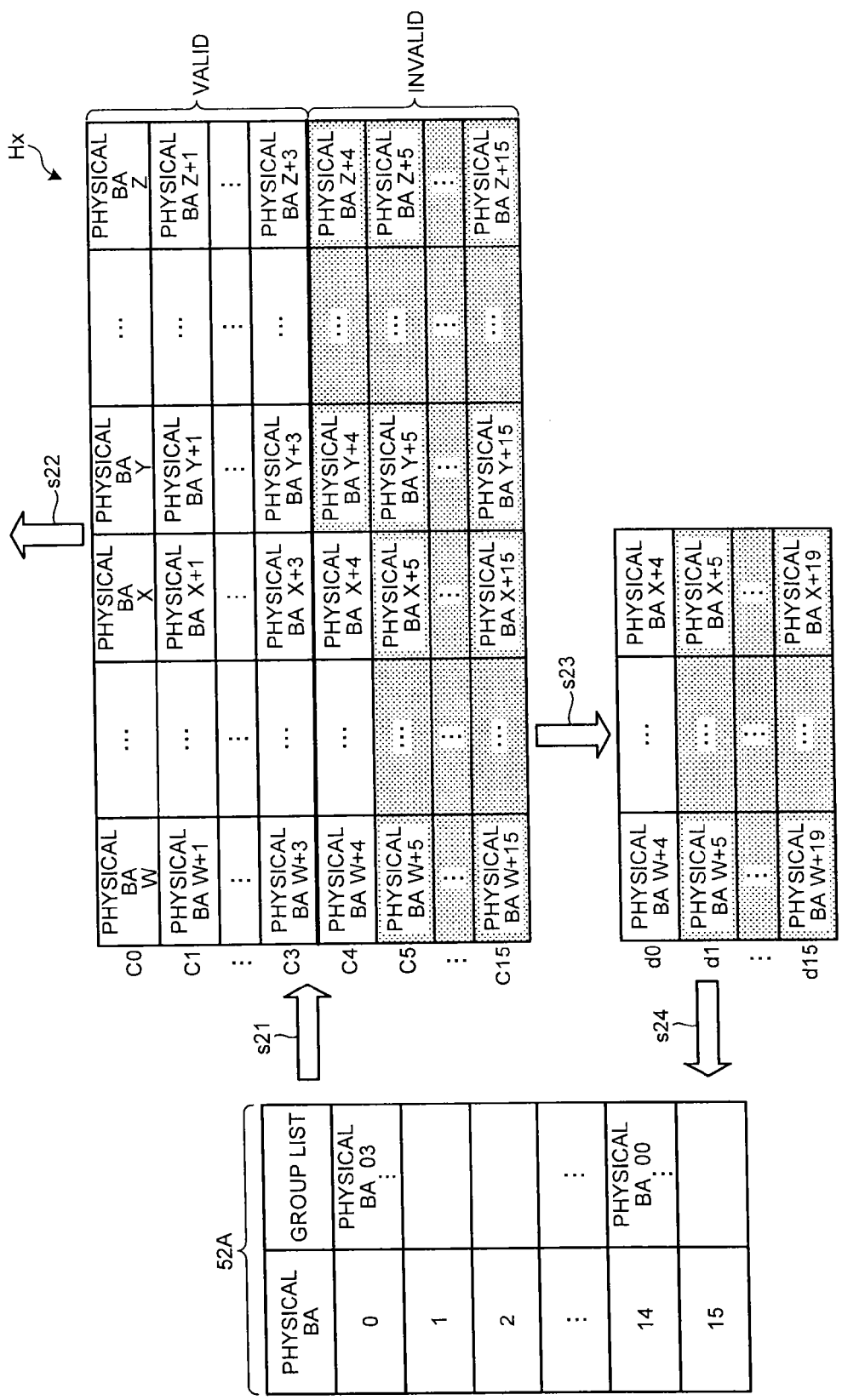

FIG.8A

BA TRANSLATION TABLE    23B

| | Slot 00 | ... | Slot R | Slot (R+1) | ... | Slot 63 |
|---|---|---|---|---|---|---|
| LOGICAL BA 00/15 | | ... | | | ... | |
| LOGICAL BA 16/31 | | ... | | | ... | |
| ⋮ | ⋮ | ⋮ | ⋮ | ⋮ | ⋮ | ⋮ |
| LOGICAL BA P/(P+15) | PHYSICAL BA W | ... | PHYSICAL BA X | PHYSICAL BA Y | ... | PHYSICAL BA Z |
| ⋮ | ⋮ | ⋮ | ⋮ | ⋮ | ⋮ | ⋮ |
| LOGICAL BA Q/(Q+15) | PHYSICAL BA W+4 | ... | PHYSICAL BA X+4 | PHYSICAL BA S | ... | PHYSICAL BA T |
| ⋮ | ⋮ | ⋮ | ⋮ | ⋮ | ⋮ | ⋮ |

FIG.8B

VALIDITY MANAGEMENT TABLE    24B

| | VALIDITY | OTHER |
|---|---|---|
| ⋮ | ⋮ | ⋮ |
| LOGICAL BA P | VALID | ... |
| ⋮ | ⋮ | ⋮ |
| LOGICAL BA P+3 | VALID | ... |
| LOGICAL BA P+4 | INVALID | ... |
| ⋮ | ⋮ | ⋮ |
| LOGICAL BA P+15 | INVALID | ... |
| ⋮ | ⋮ | ⋮ |
| LOGICAL BA Q | VALID | ... |
| LOGICAL BA Q+1 | INVALID | ... |
| ⋮ | ⋮ | ⋮ |
| LOGICAL BA Q+15 | INVALID | ... |
| ⋮ | ⋮ | ⋮ |

FIG.12

ADDRESS TRANSLATION TABLE 21B

| CLUSTER ADDRESS (LBA) | CLUSTER INFORMATION | |
|---|---|---|
| | LOGICAL BLOCK NUMBER + INTRA-LOGICAL-BLOCK STORAGE LOCATION | VALID/ INVALID |
| 0 | | 1 |
| | | 0 |
| ⋮ | ⋮ | ⋮ |
| | | 1 |
| | | 1 |
| | | 0 |
| ⋮ | ⋮ | ⋮ |
| | | 1 |
| ⋮ | ⋮ | ⋮ |

FIG.13

LOGICAL BLOCK MANAGEMENT TABLE 22B

| LOGICAL BLOCK NUMBER | BLOCK CONFIGURATION INFORMATION (PHYSICAL BLOCK NUMBER×32) | DEFECT INFORMATION | | | ERROR INFORMATION | USED/ UNUSED | INVALID FLAG |
|---|---|---|---|---|---|---|---|
| | | DEFECT FLAG Fk | DEFECTIVE SLOT Sk | NUMBER OF DEFECTIVE BLOCKS Nk | | | |
| | | ABSENT | ABSENT | | ABSENT | | |
| | | PRESENT | slot3 | | PRESENT: SLOT 5 | | |
| | | ABSENT | ABSENT | | ABSENT | | |
| ... | ... | ... | ... | ... | ... | ... | ... |

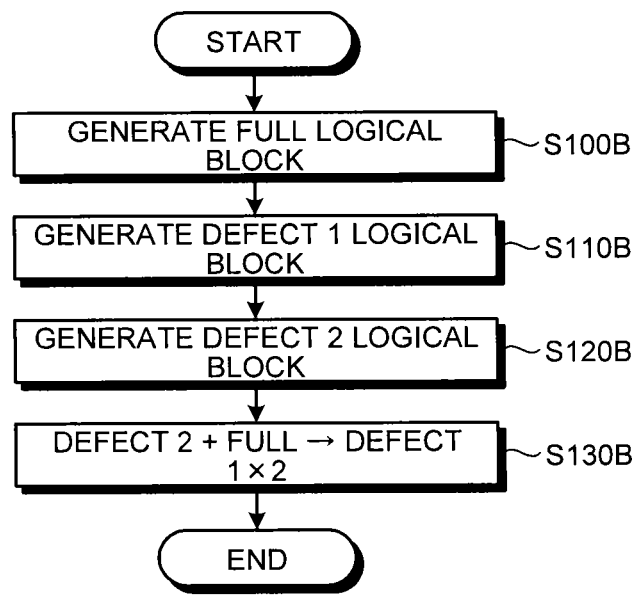

FIG.23

SYSTEM BLOCK TABLE

| LOGICAL BLOCK NUMBER | CONFIGURING BLOCK INFORMATION (PHYSICAL BLOCK NUMBER × 1) | USED/UNUSED |
|---|---|---|
|  |  |  |
|  |  |  |
|  |  |  |
| ⋮ | ⋮ |  |

FIG.24

USER BLOCK TABLE

| LOGICAL BLOCK NUMBER | CONFIGURING BLOCK INFORMATION (PHYSICAL BLOCK NUMBER × 64) | USED/UNUSED |
|---|---|---|
|  |  |  |
|  |  |  |
|  |  |  |
| ⋮ | ⋮ |  |

FIG.31

ADDRESS TRANSLATION TABLE 21D

| CLUSTER ADDRESS (LBA) | CLUSTER INFORMATION | |
| --- | --- | --- |
| | LOGICAL BLOCK NUMBER + INTRA-LOGICAL-BLOCK STORAGE LOCATION | VALID/ INVALID |
| 0 | | 1 |
| | | 0 |
| ⋮ | ⋮ | ⋮ |
| | | 1 |
| | | 1 |
| | | 0 |
| ⋮ | ⋮ | ⋮ |
| | | 1 |
| ⋮ | ⋮ | ⋮ |

FIG.32

LOGICAL BLOCK MANAGEMENT TABLE 22D

| LOGICAL BLOCK NUMBER | PHYSICAL BLOCK NUMBER × 32 | DEFECTIVE BLOCK INFORMATION | USED/ UNUSED | MANAGEMENT INFORMATION/ DATA |
| --- | --- | --- | --- | --- |
| | | | | MANAGEMENT INFORMATION |
| | | | | USER DATA |
| | | | | USER DATA |
| ⋮ | ⋮ | ⋮ | ⋮ | ⋮ |

MANAGEMENT INFORMATION GENERATING METHOD, LOGICAL BLOCK CONSTRUCTING METHOD, AND SEMICONDUCTOR MEMORY DEVICE

CROSS-REFERENCE TO RELATED APPLICATIONS

This application is based upon and claims the benefit of priority from Japanese Patent Application No. 2012-037949, filed on Feb. 23, 2012; Japanese Patent Application No. 2012-067981, filed on Mar. 23, 2012; Japanese Patent Application No. 2012-068829, filed on Mar. 26, 2012; and Japanese Patent Application No. 2012-068974, filed on Mar. 26, 2012; the entire contents of all of which are incorporated herein by reference.

FIELD

Embodiments described herein relate generally to a management information generating method, a logical block constructing method, and a semiconductor memory device.

BACKGROUND

Recently, the capacity of a NAND flash memory that is a nonvolatile semiconductor memory device has been increasing and an SSD (Solid State Drive) on which a NAND flash memory is mounted attracts attention.

Conventionally, in an SSD, a management table in a volatile memory is directly stored in a NAND flash memory that is a nonvolatile memory. However, when the size of the management table is large, a volatile memory of a large memory size is needed. Moreover, when the size of the management table is large, a long time is required for reading the management table from the NAND flash memory to the volatile memory. Therefore, it is desirable to reduce the size of the management table.

Moreover, in an SSD, in some cases, the concept of a logical block as a virtual block, in which a plurality of physical blocks as a unit for erasing in a flash memory is combined, is introduced, and erasing, writing, and reading are each performed in parallel in units of logical blocks, thereby improving the write amplification factor and achieving speed-up by the parallel processing.

Among a plurality of physical blocks in a flash memory, a bad block, which cannot be used as a storage area, is already included in the manufacturing stage in some cases. Moreover, when an SSD is used, a bad block is generated in some cases. The former bad block is referred to as a congenital bad block and the latter bad block is referred to as an acquired bad block. A logical block is in some cases composed of physical blocks excluding such a bad block.

Moreover, in an SSD, data stored in a flash memory includes user data that a user stores therein and system data as management information used in the SSD. When a logical block for user data is constructed, it is desirable to reserve a logical block for user data in which a parallelism of a predetermined number is ensured as many as possible so that a margin capacity can be reserved while excluding a congenital bad block.

BRIEF DESCRIPTION OF THE DRAWINGS

FIG. 4 is a flowchart illustrating a data read processing procedure from a NAND memory;

FIG. 5 is a flowchart illustrating a construction processing procedure of a BA translation table according to a second embodiment;

FIG. 7 is a diagram for explaining a last half of construction processing of the BA translation table according to the second embodiment;

FIG. 8A is a diagram illustrating a configuration example of the BA translation table according to the second embodiment and FIG. 8B is a diagram illustrating a configuration example of a validity management table;

FIG. 12 is a diagram illustrating an address translation table according to the third embodiment;

FIG. 13 is a diagram illustrating a logical block management table;

FIG. 14 is a diagram illustrating a bad block table;

FIG. 15 is a flowchart illustrating a construction procedure of a logical block at the initial start-up;

FIG. 23 is a diagram illustrating a system block table;

FIG. 24 is a diagram illustrating a user block table;

FIG. 31 is a diagram illustrating an address translation table according to the sixth embodiment;

FIG. 32 is a diagram illustrating a logical block management table;

DETAILED DESCRIPTION

According to a management information generating method in embodiments, a physical block address group is generated by extracting a first predetermined number of physical block addresses in a nonvolatile memory arranged in a semiconductor memory device used as an external memory device of a computer system at a time in ascending order of an address value. Moreover, when a physical block address of a bad block is included in the physical block address group, a next physical block address group is generated by setting a physical block address of a first good block after the bad block as a top physical block address of the next physical block address group. Then, all physical block addresses from a first bad block are set to the 1st bad block in each of physical block address groups. Moreover, a physical block address group set is generated by extracting a second predetermined number of physical block address groups at a time from all of the physical block address groups in descending order of the number of good blocks. The 2nd bad block is set to each physical block address group so that the number of continuous bad blocks and the number of continuous good blocks from a top in each physical block address group have the same value as a physical block address group in which the number of good blocks is the smallest in a physical block address group set, in each of generated physical block address group sets. An address management table is generated in which a logical block address group, which is a plurality of continuous logical block addresses set by using a logical block address in the nonvolatile memory corresponding to a logical address specified from a host device, and a physical block address group set are associated with each other.

A management information generating method, a logical block constructing method, and a semiconductor memory device according to embodiments will be explained below in detail with reference to the accompanying drawings. The present invention is not limited to these embodiments.

First Embodiment

Figure 1:
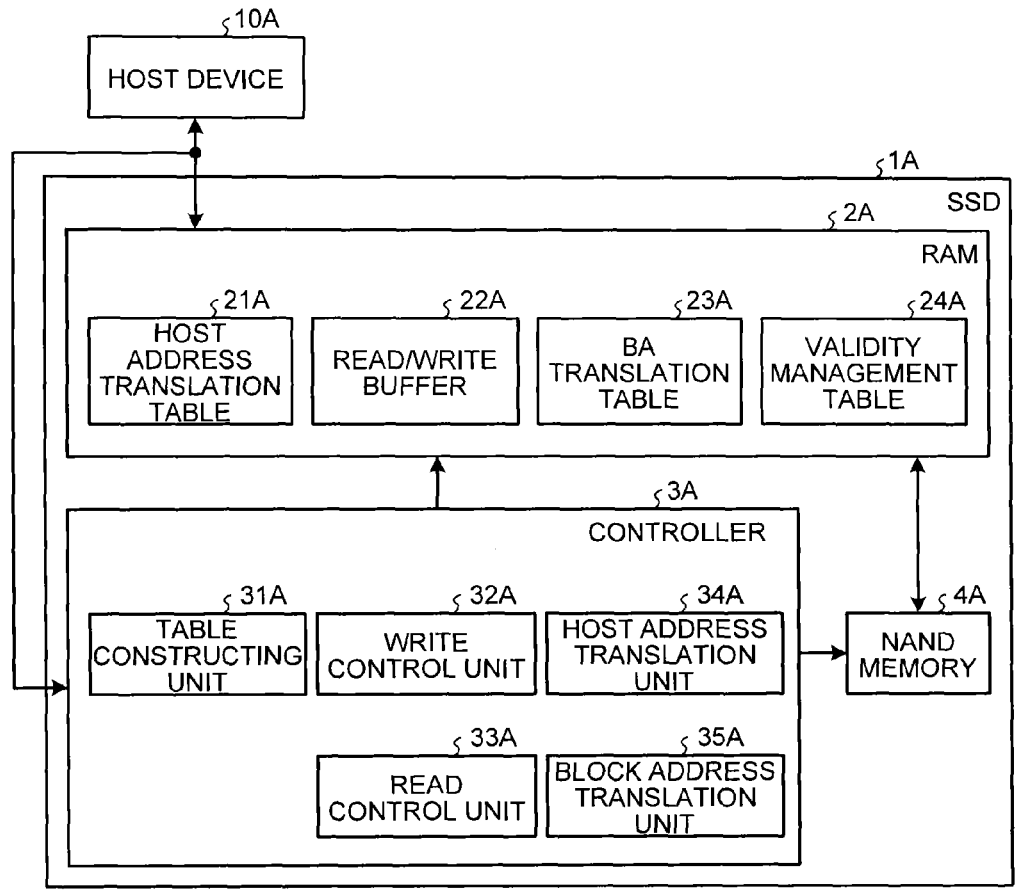
FIG. 1 is a block diagram illustrating a configuration example of an SSD according to a first embodiment.

FIG. 1 is a block diagram illustrating a configuration example of an SSD according to the first embodiment. An SSD (Solid State Drive) 1A that is a semiconductor memory device (memory system) is an external memory device used in a computer system and includes a RAM (Random Access Memory) 2A, a NAND memory 4A (nonvolatile memory) that actually stores data, and a controller 3A.

The RAM 2A is connected to a host device 10A, the controller 3A, and the NAND memory 4A. Moreover, the NAND memory 4A is connected to the controller 3A and the RAM 2A. The controller 3A is connected to the host device 10A, the RAM 2A, and the NAND memory 4A.

The RAM 2A is a memory, such as an SRAM (Static Random Access Memory), a DRAM (Dynamic Random Access Memory), and an FERAM (Ferroelectric Random Access Memory). The RAM 2A temporarily stores data sent from the host device 10A and sends the stored data to the NAND memory 4A. Moreover, when data for which a read request is issued from the host device 10A is read from the NAND memory 4A, the RAM 2A temporarily stores the read data. The data that is read from the NAND memory 4A and is temporarily stored in the RAM 2A is sent to the host device 10A.

The RAM 2A stores a host address translation table 21A, a read/write buffer 22A, a BA (block address) translation table 23A and a validity management table 24A that are management tables, and the like. The host address translation table 21A is a translation table that indicates the correspondence relationship between a logical address provided from the host device 10A and a logical block address in the NAND memory 4A. A logical block in the NAND memory 4A is one unit for erasing that is set in the SSD 1A and is associated with one or more physical blocks.

The BA translation table 23A is a translation table (address management table) that indicates the correspondence relationship between a logical block address in the NAND memory 4A and a physical block address (storage location) in the NAND memory 4A and is used for address management (read/write control). A physical block is the minimum unit that is erasable independently in the NAND memory 4A and is composed of a plurality of physical pages. In the following, a logical block address is referred to as a logical BA and a physical block address is referred to as a physical BA.

In the BA translation table 23A in the present embodiment, logical BAs of continuous address numbers are grouped. Moreover, physical BAs of continuous address numbers are grouped. Then, the grouped logical BAs and the grouped physical BAs are associated with each other. The validity management table 24A is a table that indicates the validity of a logical BA, the number of times erasing is performed on a logical BA, and the like for each logical BA.

The host address translation table 21A, the BA translation table 23A, and the validity management table 24A are loaded from the NAND memory 4A into the RAM 2A at a predetermined timing, for example, when the SSD 1A is activated.

Moreover, when the correspondence relationship between a logical address provided from the host device 10A and a logical BA in the NAND memory 4A is updated with data writing, data erasing, or the like in the NAND memory 4A, the host address translation table 21A loaded in the RAM 2A is updated.

The BA translation table 23A and the validity management table 24A are constructed, for example, when the SSD 1A is used for the first time. Moreover, when the validity of a logical BA, the number of times rewriting is performed on a logical BA, or the like is updated, the validity management table 24A loaded in the RAM 2A is updated.

The read/write buffer 22A is a buffer memory used when data transfer is performed between the NAND memory 4A and the host device 10A. Data read from the NAND memory 4A is buffered in the read/write buffer 22A and is sent to the host device 10A. Moreover, data for which a write request is issued from the host device 10A is buffered in the read/write buffer 22A and is written in the NAND memory 4A.

The controller 3A loads a table group (the host address translation table 21A, the BA translation table 23A, and the validity management table 24A) stored in the NAND memory 4A into the RAM 2A at a predetermined timing (for example, at the time of activation) and causes the table group in the RAM 2A to be stored in the NAND memory 4A at a predetermined timing. Moreover, the controller 3A performs data transfer between the host device 10A and the NAND memory 4A via the RAM 2A.

The controller 3A performs read/write control of data on the NAND memory 4A by controlling the RAM 2A and the NAND memory 4A by using the BA translation table 23A and the validity management table 24A. The controller 3A includes a table constructing unit (Generator) 31A, a write control unit 32A, a read control unit 33A, a host address translation unit 34A, and a block address translation unit 35A.

The table constructing unit 31A constructs the BA translation table 23A and the validity management table 24A by using the continuity of the address number of a logical BA or a physical BA. The table constructing unit 31A may construct the BA translation table 23A and the validity management table 24A at any time. Moreover, the table constructing unit 31A may reconstruct the BA translation table 23A and the validity management table 24A as needed.

The write control unit 32A writes data in the NAND memory 4A by using the host address translation table 21A, the BA translation table 23A, and the validity management table 24A in the RAM 2A.

The read control unit 33A reads data from the NAND memory 4A by using the host address translation table 21A, the BA translation table 23A, and the validity management table 24A in the RAM 2A.

Moreover, when data transfer is performed, the write control unit 32A and the read control unit 33A perform data management in the RAM 2A and the NAND memory 4A on the basis of the table group while updating the table group in the RAM 2A and the NAND memory 4A.

The host address translation unit 34A translates a logical address into a logical BA by using the host address translation table 21A. Moreover, the host address translation unit 34A translates a logical BA into a logical address by using the host address translation table 21A.

The block address translation unit 35A translates a logical BA into a physical BA that is a storage location in the NAND memory 4A by using the BA translation table 23A and the validity management table 24A. Moreover, the block address translation unit 35A translates a physical BA into a logical BA by using the BA translation table 23A and the validity management table 24A.

For example, when data is written in the NAND memory 4A, the write control unit 32A selects an unused valid logical block (writable logical block) by referring to the validity management table 24A. Then, the write control unit 32A writes data specified by a logical address in the selected logical block. Furthermore, the write control unit 32A registers the correspondence relationship between the logical BA of the selected logical block and the logical address in the host address translation table 21A.

Moreover, when data is read from the NAND memory 4A, the read control unit 33A sends a data translation instruction to the host address translation unit 34A and the block address translation unit 35A. Consequently, the host address translation unit 34A translates a logical address into a logical BA by using the host address translation table 21A.

The SSD 1A receives a read/write instruction from the host device 10A via a not-shown interface. The interface between the host device 10A and the SSD 1A, for example, conforms to the SATA (Serial ATA) standard, however, it is not limited to this.

The NAND memory 4A is a nonvolatile semiconductor memory, such as a NAND flash memory. The NAND memory 4A includes a memory cell array in which a plurality of nonvolatile memory cells is arranged in a matrix manner and a peripheral circuit for controlling write, read, and erase operations to the memory cell array. The memory cell array is configured by arranging a plurality of blocks such that one block is the minimum unit for data erasing. Each block is configured by arranging a plurality of pages such that one page is the minimum unit for data writing and data reading. Each memory cell may be configured to store 1 bit or may be configured to store 2 or more bits. In the NAND memory 4A, rewriting to the same page in a block is not allowed until data in the entire block including the page is once erased.

The data written from the host device 10A to the SSD 1A is stored in the NAND memory 4A in predetermined management units. Continuous addresses in a logical BA space are set as one unit for logical-physical translation (translation from a logical BA to a physical BA) and the continuous addresses are collectively assigned to a physical area in the NAND memory 4A. In the management unit, sectors of continuous logical BAs are sequentially arranged. The size of the management unit is arbitrary, however, for example, the size of the management unit can be made the same as the page size or the block size in the NAND memory 4A, the cluster size in a file system used in the host device 10A, or the like. The cluster size is equal or larger than the sector size and is equal to or smaller than the block size.

When update data written from the host device 10A is smaller than the size of the management unit, data already stored in an area that is the size of the management unit in the NAND memory 4A and the newly written update data that is smaller than the size of the management unit are merged in the RAM 2A to generate data in the size of the management unit, and then the data is written in a free space in the NAND memory 4A (read modify write). A logical BA in the NAND memory 4A to which data written from the host device 10A is written dynamically changes, and the correspondence relationship thereof is managed by the host address translation table 21A. As a logical address, for example, an LBA (Logical Block Addressing) in which serial numbers starting from zero are attached to a logical capacity in sector units is used.

The correspondence relationship between LBAs that are the size of the management unit and a data area allocated in the management unit in the NAND memory 4A will be explained. A logical address specified by the host device 10A in a write request is the size of a sector unit, however, in the SSD 1A, logical addresses are made to match the size of the management unit (for example, cluster size). Then, sectors corresponding to continuous LBAs in the management unit are collectively stored in an area in the management unit in the NAND memory 4A. For example, when the size of the management unit is equal to the cluster size, a plurality of sectors corresponding to LBAs that are made to match the cluster size is written in an area of the cluster size of the NAND memory 4A.

Figure 2:
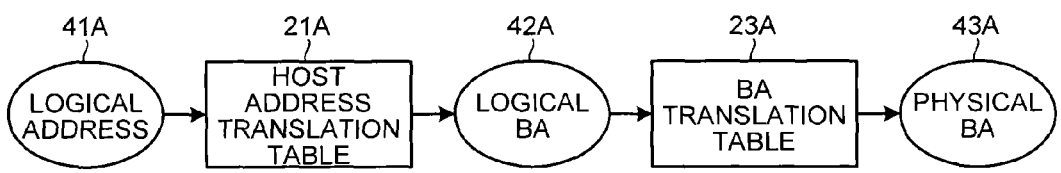
FIG. 2 is a diagram for explaining address translation performed in the SSD.

FIG. 2 is a diagram for explaining address translation performed in the SSD. The host address translation table 21A is a table that indicates a logical BA to which data specified by a logical address is written. Moreover, the BA translation table 23A is a table that indicates a physical BA in the NAND memory 4A to which data indicated by a logical BA is written.

For example, when data is written in the NAND memory 4A, a logical address 41A is specified from the host device 10A. The write control unit 32A selects an unused valid logical block by referring to the validity management table 24A. Then, the write control unit 32A writes the data specified by the logical address in the selected logical block. Furthermore, the write control unit 32A registers the correspondence relationship between the logical BA of the selected logical block and the logical address in the host address translation table 21A. Furthermore, the block address translation unit 35A translates a logical BA 42A into a physical BA 43A by using the BA translation table 23A. Then, the write control unit 32A sends a write command including the physical BA 43A to the NAND memory 4A. Consequently, data is written in the physical BA 43A corresponding to the logical address 41A.

In a similar manner, when data is read from the NAND memory 4A, the logical address 41A is specified from the host device 10A. The host address translation unit 34A translates the logical address 41A into the logical BA 42A by using the host address translation table 21A. Furthermore, the block address translation unit 35A translates the logical BA 42A into the physical BA 43A by using the BA translation table 23A. Then, the read control unit 33A sends a read command including the physical BA 43A to the NAND memory 4A. Consequently, data is read from the physical BA 43A corresponding to the logical address 41A.

In this manner, in a computer system including the SSD 1A, when accessing data in the NAND memory 4A, a logical BA is translated into a physical BA by using the BA translation table 23A.

Figure 3A:
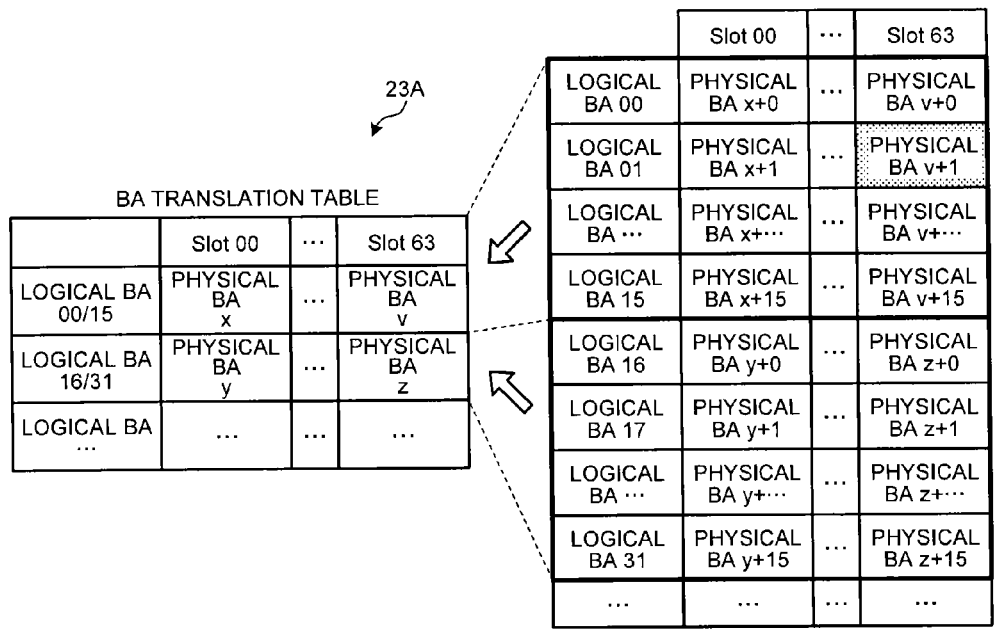
FIG. 3A is a diagram illustrating a configuration example of a block address BA) translation table according to the first embodiment and FIG. 3B is a diagram illustrating a configuration example of a validity management table according to the first embodiment.
Figure 3B:
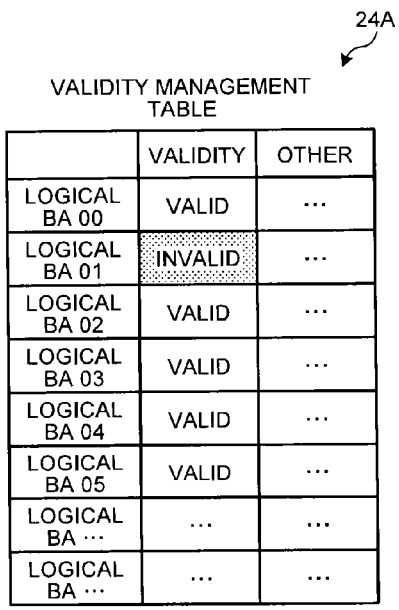

Next, the BA translation table 23A, which is one of the characteristics in the present embodiment, will be explained. FIG. 3A is a diagram illustrating a configuration example of the BA translation table according to the first embodiment and FIG. 3B is a diagram illustrating a configuration example of the validity management table according to the first embodiment.

In the BA translation table 23A, logical BAs of continuous addresses and physical BAs of continuous addresses are associated with each other. Specifically, in the BA translation table 23A, logical BAs for continuous 16 blocks and physical BAs for continuous 16 blocks are associated with each other.

For example, the table constructing unit 31A sets the logical BAs "00" to "15" for 16 blocks as one logical BA group. In other words, a plurality of logical BAs is set in one entry in the BA translation table 23A. In the BA translation table 23A in FIG. 3A, the group of the logical BAs "00" to "15" is indicated as a "logical BA 00/15".

Moreover, the table constructing unit 31A associates a set of physical BAs for 64 slots (physical BA group set) corresponding to the logical BAs "00" to "15" with the logical BAs "00" to "15". Each physical BA group in a physical BA group set includes physical BAs for 16 blocks. Therefore, the table constructing unit 31A, for example, sets physical BAs for 16 blocks as one physical BA group.

The table constructing unit 31A, for example, sets the physical BAs "x+0" to "x+15" for 16 blocks as one physical BA group and sets the physical BAs "v+0" to "v+15" for 16 blocks as one physical BA group.

Then, the table constructing unit 31A assigns the physical BAs "x+0" to "x+15" to a physical BA group corresponding to the Slot "00" of the logical BAs "00" to "15". Moreover, the table constructing unit 31A assigns the physical BAs "v+0" to "v+15" to a physical BA group corresponding to the Slot "63" of the logical BAs "00" to "15".

In the BA translation table 23A, for example, top addresses of the physical BAs "x+0" to "x+15", the physical BAs "v+0" to "v+15", and the like are registered. In FIG. 3A, the physical BA group including the physical BAs "x+0" to "x+15" is indicated as a physical BA "x". Moreover, in FIG. 3A, the physical BA group including the physical BAs "v+0" to "v+15" is indicated as a physical BA "v".

In a similar manner, the table constructing unit 31A sets logical BAs "N" to "N+15" (N is a multiple of 16) for 16 blocks as one logical BA group. Then, the table constructing unit 31A registers physical BAs for 16 blocks as one physical BA group in each slot in the BA translation table 23A. In this manner, the table constructing unit 31A associates a physical BA group in each slot and a logical BA group with each other and registers it in the BA translation table 23A.

In the BA translation table 23A in FIG. 3A, indexes, such as the logical BAs "00" to "15" and the Slot "00", are illustrated, however, the indexes may be omitted. In this case, a physical BA is read from the BA translation table 23A on the premise that each logical BA group includes logical BAs for 16 blocks and the number of slots in each logical BA group is 64.

In a physical BA, a bad block (BB), which cannot be used as a storage area due to a large number of errors or the like, is included. For example, a physical block becomes a bad block in some cases due to an erase error or a program error (write error).

The validity management table 24A illustrated in FIG. 3B is a table that manages the validity of each logical block. In the validity management table 24A, a logical BA of each logical block is associated with information (validity information) indicating the validity. A logical block in which the information indicating the validity is "valid" is a normal logical block (good block) (GB) and a logical block in which the information indicating the validity is "invalid" is a bad block.

For example, when the physical BA "v+1" corresponding to the Slot "63" of the physical BAs "00" to "15" is a bad block, the logical BA "01" corresponding to the physical BA "v+1" is registered in the validity management table 24A as "invalid". In the validity management table 24A, the number of times erasing is performed on each logical BA group or the like may be registered.

The data read processing procedure from the NAND memory 4A will be explained. FIG. 4 is a flowchart illustrating the data read processing procedure from the NAND memory. The host device 10A sends a read command and the logical address 41A that is a target for reading data to the controller 3A of the SSD 1A.

The host address translation unit 34A of the controller 3A translates the logical address 41A into the logical BA 42A by using the host address translation table 21A (Step S10A). At this time, the host address translation unit 34A translates the logical address 41A into the logical BA 42A and an offset in the logical block. The value of the offset is a value used when the position of a slot is calculated and the unit of the offset is equal in size to the data management unit in the SSD 1A. The host address translation unit 34A calculates a Slot position C (C is any of 00 to 63) in advance by using the value of the offset.

Furthermore, the block address translation unit 35A translates the logical BA 42A into the physical BA 43A by using the BA translation table 23A. Specifically, the block address translation unit 35A calculates a quotient "A" and a remainder "B" obtained by dividing the logical BA by 16 (Step S20A). Then, the block address translation unit 35A sets an (A+1)th stage of the BA translation table 23A to a read target position of a physical BA. The block address translation unit 35A extracts (reads) the physical BA at the Slot position C in the (A+1)th stage from the BA translation table 23A (Step S30A). The block address translation unit 35A calculates a value obtained by adding the "B" to the extracted physical BA as the physical BA 43A that is a target for reading (Step S40A).

The physical BA 43A calculated by the block address translation unit 35A becomes a physical BA corresponding to the logical address 41A sent from the host device 10A. The read control unit 33A sends a read command including the physical BA 43A to the NAND memory 4A. Consequently, data in the physical BA 43A corresponding to the logical address 41A is read.

In the present embodiment, an explanation is given of a case where a logical BA group and a physical BA group are each composed of a group of 16 block addresses, however, it is sufficient that a logical BA group and a physical BA group are each composed of a group of two or more block addresses.

Moreover, in the present embodiment, an explanation is given of a case where 64 slots are allocated to a logical BA group, however, the number of slots allocated to a logical BA group may be less than 64 or equal to or more than 65.

In this manner, according to the first embodiment, logical BAs of continuous addresses and physical BAs of continuous addresses are associated with each other in the BA translation table 23A, therefore, the BA translation table 23A can be compressed efficiently. Thus, the memory capacity of the RAM 2A needed for the SSD 1A can be reduced.

Moreover, because the size of the BA translation table 23A stored in the NAND memory 4A and the RAM 2A becomes small, the life of the SSD 1A can be extended. Moreover, because the size of the BA translation table 23A stored in the NAND memory 4A becomes small, the time required for writing and reading the BA translation table 23A to and from the NAND memory 4A can be reduced.

Moreover, because the size of the BA translation table 23A becomes small, it is possible to reduce the activation time of the SSD 1A and the transition time to a standby state. Moreover, the cost for block address translation from a logical BA into a physical BA can be suppressed. Moreover, the BA translation table 23A can be constructed without increasing the number of logical blocks.

Moreover, address translation between a logical BA and a physical BA can be speeded up by using the BA translation table 23A (address translation is not delayed compared with a case where the BA translation table 23A is not compressed).

Second Embodiment

Next, the second embodiment of the present invention will be explained with reference to FIG. 5 to FIG. 8. In the second embodiment, physical BA groups having approximately the same number of good blocks are collected and are associated with one logical BA group.

FIG. 5 is a flowchart illustrating a construction processing procedure of the BA translation table according to the second embodiment. Moreover, FIG. 6 is a diagram for explaining construction processing (first half processing) of the BA translation table according to the second embodiment and FIG. 7 is a diagram for explaining construction processing (last half processing) of the BA translation table according to the second embodiment.

Figure 6:
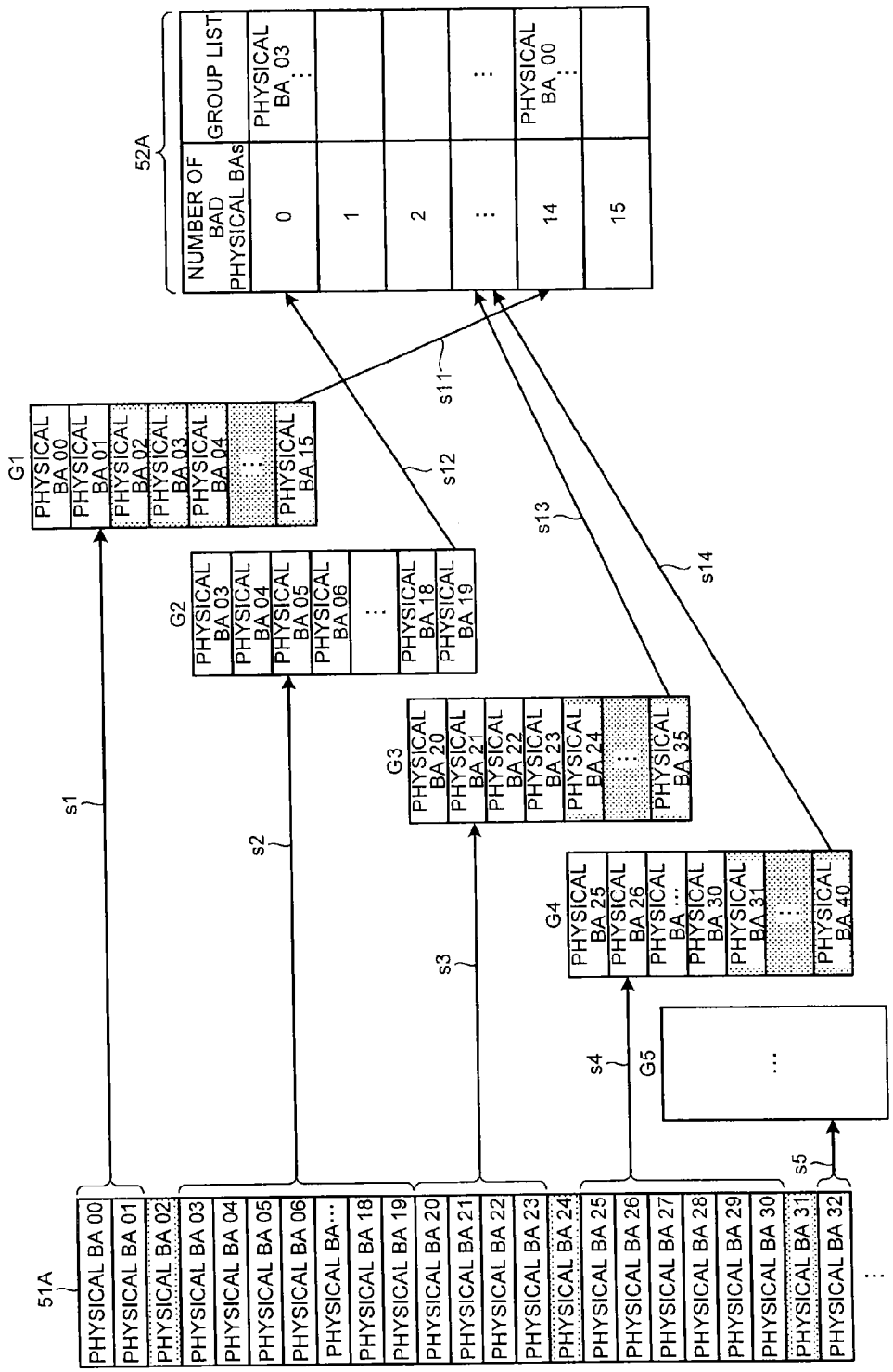
FIG. 6 is a diagram for explaining a first half of construction processing of the BA translation table according to the second embodiment.

As shown in FIG. 6, the table constructing unit 31A reads a physical block state 51A indicating the state (valid/invalid) of physical blocks in the NAND memory 4A for each physical BA by accessing the NAND memory 4A (Step S110A). In the physical block state 51A, valid/invalid of each physical block is indicated in order of a physical BA. FIG. 6 illustrates a case where each of the physical blocks having physical BAs "02", "24", and "31" is a bad block (invalid) in the physical block state 51A.

The table constructing unit 31A generates physical BA groups and organizes the physical BA groups on the basis of the physical block state 51A (Step S120A). For example, the table constructing unit 31A extracts 16 physical BAs at a time from the physical block state 51A in ascending order of the address values as a physical BA group. At this time, when a physical BA of a bad block is included in a physical BA group composed of 16 physical BAs, the table constructing unit 31A sets a physical BA of a good block next to the bad block as the top physical BA of the next physical BA group. In the following, a physical BA of a bad block is referred to as a bad physical BA and a physical BA of a good block is referred to as a good physical BA.

For example, when a physical BA group is generated from the physical block state 51A shown in FIG. 6, the table constructing unit 31A extracts the physical BAs "00" to "15" as one physical BA group. Specifically, the table constructing unit 31A extracts the physical BAs "00" to "15" as a first physical BA group G1 (s1 in FIG. 6).

In the present embodiment, because the physical BA "02" is a bad block BA, the table constructing unit 31A sets the physical BA "03" that is a good physical BA next to the physical BA "02" as a top physical BA of a physical BA group to be extracted next. Then, the table constructing unit 31A extracts 16 continuous physical BAs in total starting from the physical BA "03" as one physical BA group. Specifically, the table constructing unit 31A extracts the physical BAs "03" to "19" as one physical BA group G2 (s2 in FIG. 6).

When a plurality of bad physical BAs continues, the table constructing unit 31A sets a good physical BA immediately after the continuity of the bad physical BAs is broken as a top physical BA of the next physical BA group.

After the table constructing unit 31A extracts the physical BAs "03" to "19" as the second physical BA group G2, the table constructing unit 31A extracts the third physical BA group. In the present embodiment, because a bad physical BA is not included in the physical BAs "03" to "19", the table constructing unit 31A sets the physical BA "20" as a top physical BA of the next physical BA group. Then, the table constructing unit 31A extracts 16 continuous physical BAs in total starting from the physical BA "20" as one physical BA group. Specifically, the table constructing unit 31A extracts the physical BAs "20" to "35" as a third physical BA group G3 (s3 in FIG. 6).

In the present embodiment, because the physical BA "24" is a bad physical BA, the table constructing unit 31A sets the physical BA "25" as a top physical BA of the next physical BA group. Then, the table constructing unit 31A extracts 16 continuous physical BAs in total starting from the physical BA "25" as one physical BA group. Specifically, the table constructing unit 31A extracts the physical BAs "25" to "40" as a fourth physical BA group G4 (s4 in FIG. 6).

In the present embodiment, because the physical BA "31" is a bad physical BA, the table constructing unit 31A sets the physical BA "32" as a top physical BA of the next physical BA group. Then, the table constructing unit 31A extracts 16 continuous physical BAs in total starting from the physical BA "32" as a fifth physical BA group G5 (s5 in FIG. 6).

The table constructing unit 31A groups all the physical BAs into physical BA groups. In other words, the table constructing unit 31A repeats the following processing.
(1) The table constructing unit 31A extracts 16 continuous physical BAs in total as one physical BA group.
(2) When a bad physical BA is included in the extracted physical BA group, the table constructing unit 31A sets the first good physical BA after the bad physical BA as a top physical BA of the next physical BA group.

Furthermore, the table constructing unit 31A sets all the physical BAs after the first bad physical BA in each physical BA group to a bad physical BA. For example, in the physical BA group G1 composed of the physical BAs "00" to "15", the physical BA "02" is a bad physical BA, therefore, the table constructing unit 31A sets all the physical BAs "02" to "15" in the physical BA group G1 to a bad physical BA.

Consequently, the number of bad physical BAs in the physical BA group G1 composed of the physical BAs "00" to "15" is set to 14. Moreover, the number of bad physical BAs in the physical BA group G2 is set to 0 and the number of bad physical BAs in the physical BA group G3 is set to 12.

Then, the table constructing unit 31A organizes physical BA groups. Specifically, the table constructing unit 31A generates number-of-bad-blocks information 52A by grouping physical BA groups by the number of bad physical BAs (s11 to s14 in FIG. 6). The number-of-bad-blocks information 52A is information obtained by grouping physical BA groups by the number of bad physical BAs. In the number-of-bad-blocks information 52A, the number of bad physical BAs and a physical BA group (group list) are associated with each other.

For example, in the number-of-bad-blocks information 52A, the physical BA group G2 composed of the physical BAs "03" to "19" is registered in a physical BA group in which the number of bad physical BAs is zero. It is sufficient that the physical BA "03" that is the top physical BA in the physical BA group G2 is registered in the number-of-bad-blocks information 52A as information indicating the physical BA group G2.

In a similar manner, in the number-of-bad-blocks information 52A, the physical BA group G1 is registered in a physical BA group in which the number of bad physical BAs is 14. The physical BA "00" that is the top physical BA in the physical BA group G1 is registered in the number-of-bad-blocks information 52A as information indicating the physical BA group G1.

Thereafter, the table constructing unit 31A constructs a BA translation table 23B to be described later by using the number-of-bad-blocks information 52A. The BA translation table 23B is a table having a configuration similar to that of the BA translation table 23A. In other words, in the BA translation table 23B, physical BA groups for 64 slots are associated with one logical BA group.

In order to construct the BA translation table 23B, the table constructing unit 31A sequentially extracts 64 slots at a time of physical BA groups in which the number of bad physical BAs is small from the number-of-bad-blocks information 52A (s21 in FIG. 7). In other words, the table constructing unit 31A extracts 64 slots at a time of physical BA groups, from among all the physical BA groups, in descending order of the number of good blocks in a physical BA group. FIG. 7 illustrates a case where physical BA groups in which the number of bad physical BAs is four to three are extracted for 64 slots. In the following, physical BA groups for 64 slots extracted by the processing in s21 are referred to as a physical BA group set Hx.

The table constructing unit 31A extracts the physical BAs "W" to "W+15" as one physical BA group and extracts the physical BAs "X" to "X+15" as one physical BA group. In a similar manner, the table constructing unit 31A extracts the physical BAs "Y" to "Y+15" as one physical BA group and extracts the physical BAs "Z" to "Z+15" as one physical BA group. In this manner, the table constructing unit 31A sets 16 physical BAs as one physical BA group and extracts the physical BA group set Hx including 64 groups (64 slots).

Then, the table constructing unit 31A forms a logical BA group for each of the extracted physical BAs for 64 slots. Specifically, the table constructing unit 31A determines whether a logical BA group (group composed of 16 logical BAs) can be formed by using the extracted physical BA groups for 64 slots (Step S130A). When physical BAs for 64 slots can be extracted, the table constructing unit 31A determines that a logical BA group can be formed by using the physical BA groups for 64 slots.

When a logical BA group can be formed (Yes in Step S130A), the table constructing unit 31A forms a logical BA group and registers it in the BA translation table 23B (Step S140A). The physical BA groups registered in the BA translation table 23B are deleted from the number-of-bad-blocks information 52A.

When the table constructing unit 31A registers a logical BA group in the BA translation table 23B, the table constructing unit 31A sets the validity for each logical BA in the logical BA group. At this time, the table constructing unit 31A selects a physical BA group in a slot in which the number of bad physical BAs is the largest from the physical BA group set Hx. The table constructing unit 31A extracts physical BA groups in ascending order of the number of bad physical BAs, therefore, the table constructing unit 31A selects a physical BA group (physical BA group of the physical BA "Z") of the Slot 63 that is the last slot. Then, physical BAs set in the stage same as the bad physical BA of the selected physical BA group are all set to a bad physical BA.

In other words, the table constructing unit 31A sets a bad block in each physical BA group so that the number of continuous bad blocks and the number of continuous good blocks from the top in each physical BA group are the same as those in a physical BA group, in which the number of good blocks is the smallest in the physical BA group set, in the physical BA group set.

For example, when a physical BA from the M-th stage (M is a natural number) is a bad physical BA in the physical BA group of the Slot 63, physical BAs from the M-th stage are all set to a bad physical BA also in physical BA groups of other slots. In the case of FIG. 7, in the physical BA group of the physical BA "Z", physical BAs up to the c3-th stage are good physical BAs and physical BAs from the c4-th stage are bad physical BAs. Therefore, the table constructing unit 31A generates a physical BA group set Hx2 (not shown), in which physical BAs up to the c3-th stage are set to a good physical BA and physical BAs from the c4-th stage are set to a bad physical BA, for all the physical BA groups of the Slots 00 to 63.

In the case of the physical BA group set Hx extracted in s21 in FIG. 7, the physical BA "W+4" and the physical BA "X+4" are physical BAs in the c4-th stage. Therefore, the table constructing unit 31A generates the physical BA group set Hx2 in which the physical BA "W+4" and the physical BA "X+4" are set to a bad physical BA.

Then, the physical BAs of the Slots 00 to 63 in the c0-th stage are set to one logical BA and the physical BAs of the Slots 00 to 63 in the c1-th stage are set to one logical BA. In a similar manner, the physical BAs of the Slots 00 to 63 in the c3-th stage, the physical BAs of the Slots 00 to 63 in the c4-th stage, . . . , and the physical BAs of the Slots 00 to 63 in the c15-th stage are each set to one logical BA. Then, the table constructing unit 31A sets the validity for each logical BA.

FIG. 8A is a diagram illustrating a configuration example of the BA translation table according to the second embodiment and FIG. 8B is a diagram illustrating a configuration example of the validity management table. The BA translation table 23B is a table that has a configuration similar to that of the BA translation table 23A and a validity management table 24B is a table that has a configuration similar to that of the validity management table 24A.

The physical BA group set Hx2 corresponding to a logical BA group is registered in the BA translation table 23B. In the case of the physical BA group set Hx2, the physical BAs "W" to "Z" in the c0-th stage are set to the logical BA "P" and the physical BAs "W+1" to "Z+1" in the c1-th stage are set to the logical BA "P+1". In a similar manner, the physical BAs "W+3" to "Z+3" in the c3-th stage, the physical BAs "W+4" to "Z+4" in the c4-th stage, . . . , and the physical BAs "W+15" to "Z+15" in the c15-th stage are set to the logical BAs "P+3", "P+4", . . . , and "P+15", respectively.

Then, the logical BAs "P" to "P+15" for 16 blocks are set as one logical BA group and are associated with the physical BA group set Hx2 for 16 blocks×64 slots, and are registered in the BA translation table 23B.

In the BA translation table 23B in FIG. 8A, the logical BA group of the logical BAs "P" to "P+15" is indicated as a "logical BA P/(P+15)". Moreover, in a physical BA group in each slot, the top physical BA of a physical BA group is registered. Therefore, in the BA translation table 23B, the physical BAs "W" to "Z" are associated with the "logical BA P/(P+15)" and are registered (s22 in FIG. 7).

Moreover, the table constructing unit 31A registers the validity of each logical BA in a logical BA group in the validity management table 24B (Step S150A). In the present embodiment, because the logical BAs "P" to "P+3" from the c0-th stage to the c3-th stage are set to a good physical BA, "valid" is set to the logical BAs "P" to "P+3". Moreover, because the logical BAs from the c4-th stage to the c15-th stage are set to a bad physical BA, "invalid" is set to the logical BAs "P+4" to "P+15" from the c4-th stage to the c15-th stage.

Thereafter, good blocks of invalid logical BAs are changed into a physical BA group to be organized (Step S160A). Specifically, the table constructing unit 31A extracts physical BA groups having a physical BA translated from a good physical BA into a bad physical BA when generating the physical BA group set Hx2 in the physical BA group set Hx. In other words, the table constructing unit 31A extracts physical BA groups having a good physical BA that is not registered in the BA translation table 23B in the physical BA group set Hx.

In the present embodiment, when the logical BA group of the physical BA group set Hx is formed, the good blocks of the physical BAs "W+4" to "X+4" are not used, therefore, the table constructing unit 31A generates a new logical BA group by using the physical BAs "W+4" to "X+4". At this time, the top of the logical BA group becomes the physical BA "W+4" and the number of bad blocks becomes 15.

In other words, when the physical BA group set Hx2 is generated, the physical BAs "W+4" to "X+4" are translated into bad physical BAs, therefore, the physical BA groups of the physical BAs "W" to "X" are extracted (s23 in FIG. 7).

Then, for each extracted physical BA group, the table constructing unit 31A generates a new physical BA group in which a good physical BA (hereinafter, referred to as unregistered physical BA) that is not registered in the BA translation table 23B is used. At this time, the table constructing unit 31A sets an unregistered physical BA having the smallest value in each of the extracted physical BA groups as a top physical BA of a new physical BA group. The table constructing unit 31A generates new physical BA groups for all the extracted physical BA groups.

In the present embodiment, the physical BA group composed of the physical BAs "W+4" to "W+19", the physical BA group composed of the physical BAs "X+4" to "X+19", and the like are generated as new physical BA groups.

Then, the table constructing unit 31A registers the generated new physical BA groups in the number-of-bad-blocks information 52A (s24 in FIG. 7). For example, in the physical BA group composed of the physical BAs "X+4" to "X+19", the number of good physical BAs is one, therefore, the physical BA group is registered in a group list in which the number of bad physical BAs is 15.

The table constructing unit 31A repeats the processing similar to s21 to s24 in FIG. 7 described above by using the newly registered number-of-bad-blocks information 52A. Consequently, a physical BA group newly registered in the number-of-bad-blocks information 52A is also registered in the BA translation table 23B. At this time, the newly registered physical BA group configures a physical BA group set for 64 slots together with other physical BA groups to be registered in the BA translation table 23B as a physical BA group set.

Specifically, the physical BAs "W+4" to "X+4" in the d0-th stage are set to the logical BA "Q", the physical BAs "W+5" to "X+5" in the d1-th stage are set to the logical BA "Q+1", and the physical BAs "W+19" to "X+19" in the d15-th stage are set to the logical BA "Q+15". In a similar manner, the physical BAs "S" to "T" in the d0-th stage of other physical BA groups are set to the logical BA "Q".

A physical BA group registered in the BA translation table 23B does not need to have 16 physical BAs. For example, a new physical BA group composed of 12 physical BAs "W+4" to "W+19" may be registered in the BA translation table 23B. In this case, logical BAs corresponding to the 13th and subsequent physical BAs are set "invalid" in the number-of-bad-blocks information 52A. In other words, in a new physical BA group, when the number of physical BAs is less than 16, it is determined that a bad block is present in a portion in which a physical BA is insufficient.

After logical BAs are set, the logical BAs "Q" to "Q+15" for 16 blocks are set as one logical BA group, are associated with a physical BA group set Hx3 for 16 blocks×64 slots, and are registered in the BA translation table 23B.

In the BA translation table 23B in FIG. 8A, the group of the logical BAs "Q" to "Q+15" is indicated as a "logical BA Q/(Q+15)". Moreover, in a physical BA of each slot, the top physical BA of a physical BA group is registered. Consequently, in the BA translation table 23B, the physical BAs "W+4" to "X+4" and "S" to "T" are associated with the "logical BA Q/(Q+15)" and are registered.

Then, the table constructing unit 31A registers the validity of each logical BA in a logical BA group in the validity management table 24A. In the present embodiment, because the logical BA "Q" in the d0-th stage is set to a good physical BA, "valid" is set to the logical BA "Q". Moreover, because the logical BAs from the d1-th stage to the d11-th stage are set to a bad physical BA and a physical BA is not present from the d12-th stage to the d15-th stage, "invalid" is set to the logical BAs "Q+1" to "Q+15" from the d1-th stage to the d15-th stage.

Thereafter, the processing in Steps S130A to S160A is repeated until a logical BA group cannot be formed. When a logical BA group cannot be formed (No in Step S130A), the generation processing of the BA translation table 23B ends.

When physical BA groups for less than 64 slots are left, the table constructing unit 31A directly registers the physical BA group set in which the number of slots is less than 64 in the BA translation table 23B. In this case, if there is a plurality of good blocks in a physical BA group, the physical BA group may be divided into a plurality of groups and the good blocks may be distributed to the divided physical BA groups. For example, if a physical BA group including two good blocks remains, the table constructing unit 31A generates two physical BA groups, that is, a physical BA group including one good block and a physical BA group including one good block. Then, the table constructing unit 31A generates a physical BA group set by using the two physical BA groups, associates the physical BA group set with a logical BA group, and registers them in the BA translation table 23B.

When the BA translation table 23B is configured, if there is a bad block, a logical block corresponding to the bad block cannot be used. In the present embodiment, the BA translation table 23B is constructed while organizing bad blocks, thereby increasing the compression ratio of the BA translation table 23B and reducing the memory capacity of the RAM 2A needed for the SSD 1A.

In this manner, according to the second embodiment, when the BA translation table 23B is constructed, the table constructing unit 31A collects physical BA groups having approximately the same number of good blocks and associates them with one logical BA group. Consequently, the compression ratio of the BA translation table 23B can be increased.

Moreover, because a physical BA group composed of continuous physical BAs is registered in the BA translation table 23B, the construction processing time for the BA translation table can be shortened. Moreover, translation from a logical BA into a physical BA can be performed in a short time.

Moreover, physical BA groups are combined in ascending order of the number of bad physical blocks, therefore, bad physical blocks can be collected. Thus, the compression ratio of the BA translation table 23B can be increased.

Moreover, because the BA translation table 23B is constructed by sequentially extracting physical BA groups in ascending order of the number of bad physical BAs in a physical BA group, the BA translation table 23B can be constructed without searching for a combination of good blocks, a combination of bad blocks, or the like. Thus, the construction processing of the BA translation table 23B can be performed in a short time according to the linear order of the number of physical blocks.

In this manner, according to the first and second embodiments, data in a nonvolatile memory can be managed by a management table of a small size.

Third Embodiment

Next, an explanation is given of a method of reserving logical blocks in which a certain degree of parallelism is ensured as many as possible by managing a logical block in which a bad block is present among physical blocks as a logical block having a defect.

Figure 9:
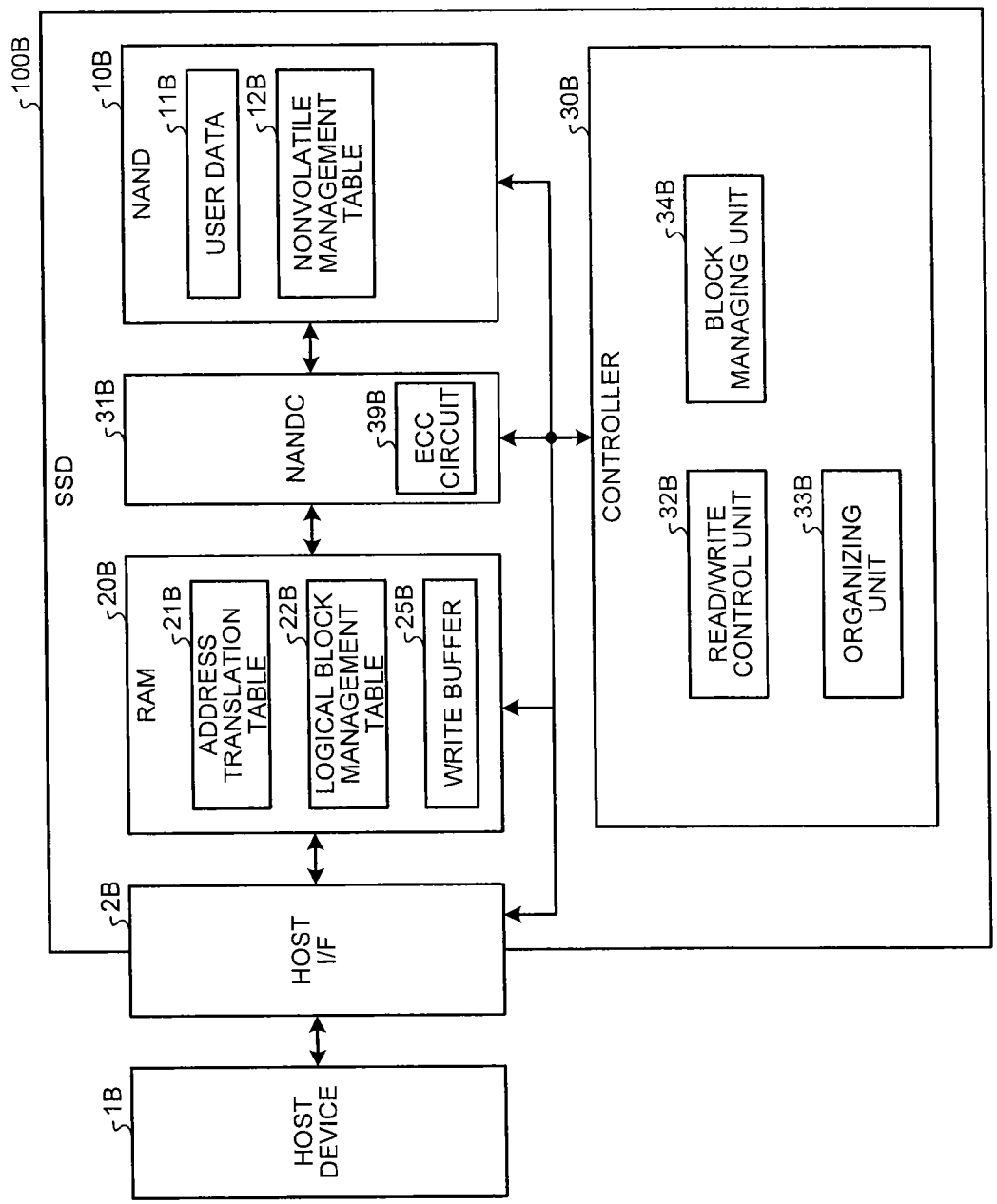
FIG. 9 is a block diagram illustrating an internal configuration example of an SSD according to a third embodiment.

FIG. 9 is a block diagram illustrating a configuration example of an SSD (Solid State Drive) 100B according to the third embodiment. The SSD 100B is connected to a host device (hereinafter, host) 1B, such as a personal computer or a CPU (Central Processing Unit), via a host interface 2B, such as an ATA interface (ATA I/F), and functions as an external storage device of the host 1B. Examples of the host 1B include a CPU of a personal computer and a CPU of an imaging device, such as a still camera and a video camera. The SSD 100B includes the host interface 2B, a NAND flash memory (hereinafter, NAND) 10B that is a nonvolatile semiconductor memory, a RAM 20B that is a semiconductor memory capable of performing a high-speed access compared with the NAND 10B, a NAND controller (NANDC) 31B, and a controller 30B.

The NAND 10B stores therein user data 11B specified by the host 1B and management information managed in the RAM 20B for backup as a nonvolatile management table 12B. The NAND 10B includes a memory cell array in which a plurality of memory cells is arrayed in a matrix manner, and each memory cell is capable of multi-value recording by using an upper page and a lower page. The NAND 10B includes a plurality of memory chips and each memory chip is configured by arraying a plurality of physical blocks such that one physical block is one unit for data erasing. In the NAND 10B, writing and reading of data is performed in units of physical pages. A physical block consists of a plurality of physical pages.

Figure 10:
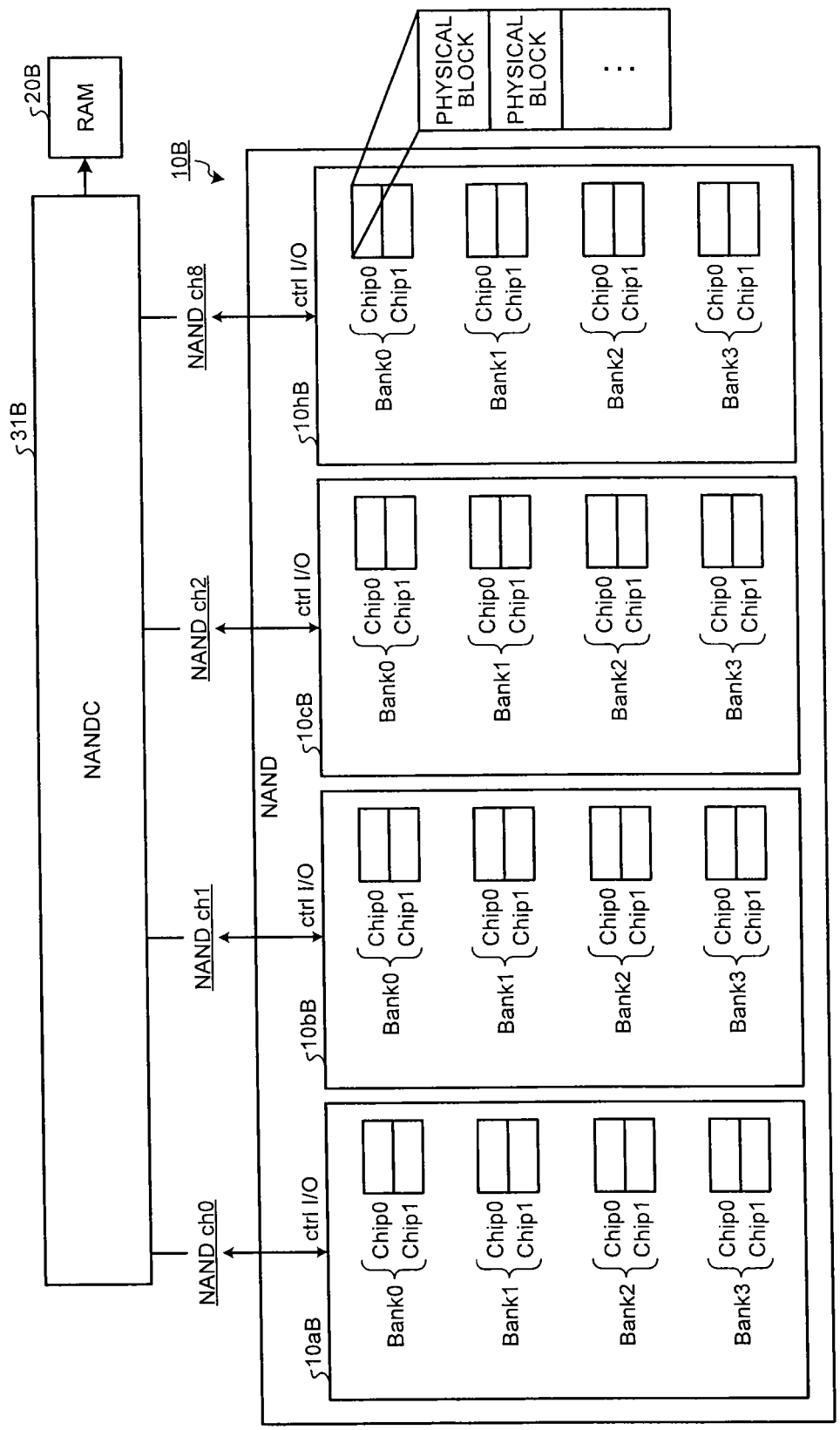
FIG. 10 is a diagram illustrating an internal configuration example of a NAND according to the third embodiment.

FIG. 10 illustrates a detailed configuration example of the NAND 10B. In this embodiment, the NAND 10B is connected to the NAND controller (NANDC) 31B in parallel via eight channels (8ch: ch0 to ch7) and therefore can operate eight channel parallel operation elements 10aB to 10hB in parallel. The number of channels is not limited to eight and any number can be arbitrary employed. Each of the parallel operation elements 10aB to 10hB includes a plurality of banks (in this case, four banks (Bank0 to Bank3)) capable of performing a bank interleave. Each bank includes a plurality of memory chips (in this case, two memory chips (Chip0 and Chip1)). In this manner, each memory chip of the NAND 10B can perform a parallel operation by a plurality of channels and a parallel operation using a bank interleave operation by a plurality of banks.

In this manner, in the NAND 10B, a parallel operation by a plurality of channels and a parallel operation by a plurality of banks can be performed. When the number of channels is 8 and the number of banks is 4, up to 32 physical blocks can be operated in parallel.

The RAM 20B includes a storage area as a write buffer 25B for temporarily storing data when the data is written from the host 1B to the NAND 10B, a storage area for storing and updating management information, such as an address translation table 21B and a logical block management table 22B, and a work area, for example, for temporarily storing data read from the NAND 10B. The management information, such as the address translation table 21B and the logical block management table 22B, is obtained by loading the nonvolatile management table 12B stored in the NAND 10B at the time of activation or the like.

When the host 1B outputs a read request or a write request to the SSD 100B, the host 1B inputs an LBA (Logical Block Addressing) as a logical address to the SSD 100B via the host interface 2B. An LBA is a logical address in which serial numbers starting from zero are attached to sectors (size: for example, 512 B). In the present embodiment, as a unit for managing data in the write buffer 25B and the NAND 10B, a management unit referred to as a cluster, which is larger than the sector size and smaller than the physical block size, is defined. In this embodiment, one type of management unit referred to as cluster is used, however, it is possible to add another management unit that is larger than the cluster size and is equal to or smaller than the physical block size and use two types of management unit.

In the SSD 100B, as a unit for collectively managing a plurality of physical blocks, a virtual block, which is referred to as a logical block, is defined. In this embodiment, a logical block is formed by combining physical block in such a way that a channel parallel operation and a bank interleave can be performed. In other words, a logical block is composed of physical blocks the number of which is determined by the number of channels×the number of banks. As shown in FIG. 10, if the number of channels is 8 and the number of banks is 4, a logical block is composed of up to 32 physical blocks.

Figure 11:
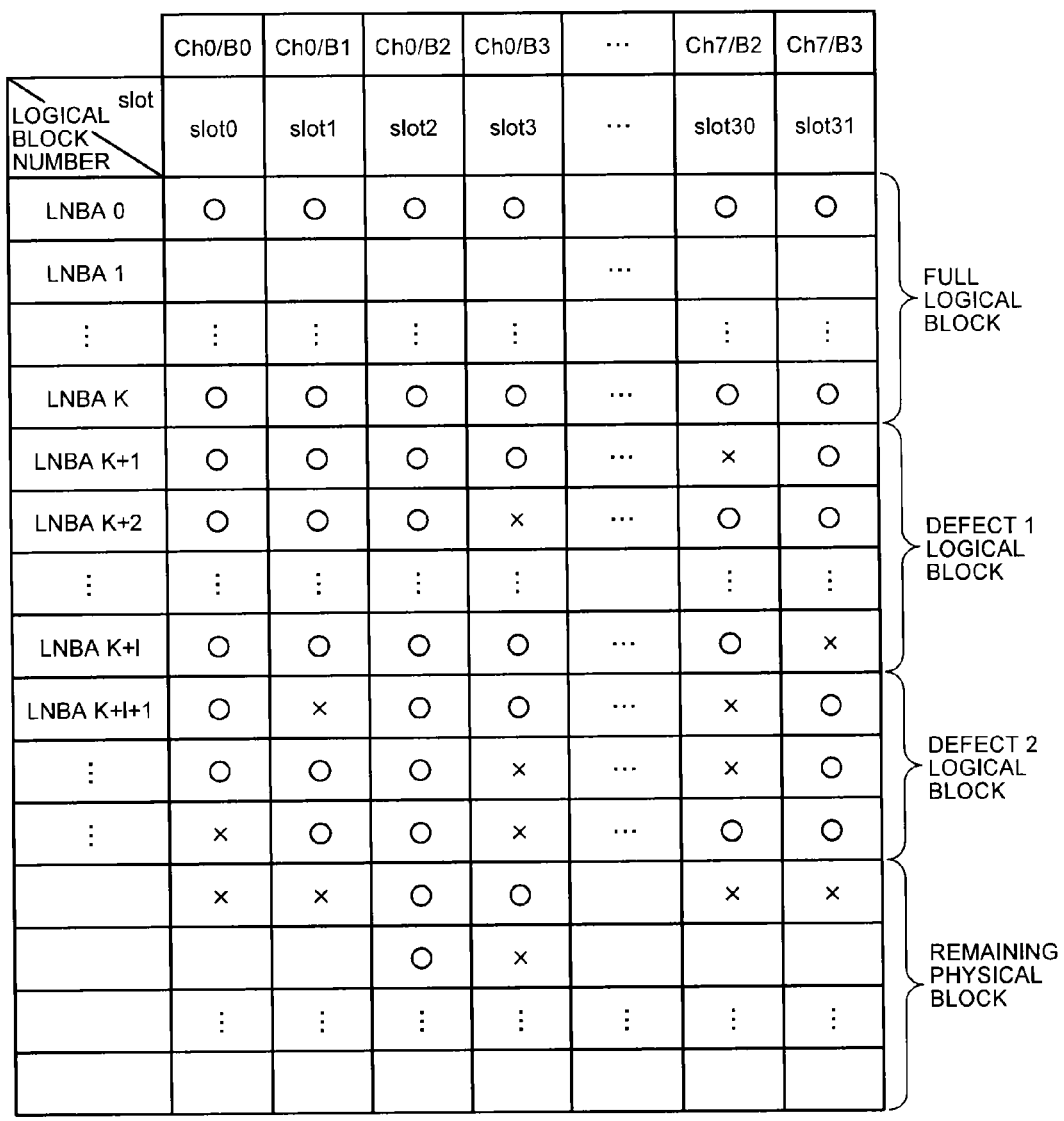
FIG. 11 is a diagram illustrating the types of a logical block.

As shown in FIG. 12, as an index of a plurality of physical blocks configuring a logical block, the term "slot" is used. In this embodiment, a slot corresponds to a combination of the channel number and the bank number. In other words, the slot 0 corresponds to the channel 0 and the bank 0, the slot 1 corresponds to the channel 0 and the bank 1, the slot 2 corresponds to the channel 0 and the bank 2, the slot 3 corresponds to the channel 0 and the bank 3, the slot 4 corresponds to the channel 1 and the bank 0, ..., and the slot 30 corresponds to the channel 7 and the bank 2, and the slot 31 corresponds to the channel 7 and the bank 3. In FIG. 11, a circle indicates a normal physical block and a cross indicates a bad block.

As shown in FIG. 11, a logical block composed of 32 physical blocks capable of ensuring a maximum parallelism is referred to as a full logical block. In this embodiment, in a logical block, no more than a predetermined number Z of defective physical blocks are allowed. In this embodiment, Z is set to one, however, Z may be set to two, three, or the like. A defective physical block is a bad block BB that cannot be used as a storage area due to a large number of errors or the like. As described above, a bad block includes a congenital bad block and an acquired bad block. A logical block in which Z=1 is composed of 31 physical blocks and 1 bad block. A physical block in which Z=1 is referred to as a defect 1 logical block. Therefore, a defect 2 logical block is a logical block in which Z=2 and which is composed of 30 physical blocks and 2 bad blocks. Moreover, a block that does not belong to any of a full logical block, a defect 1 logical block, a defect 2 logical block is referred to as a remaining physical block.

As shown in FIG. 12, in the address translation table 21B managed in the RAM 20B, the correspondence between a cluster address of an LBA and cluster information is registered. A cluster address is obtained by dividing an LBA by the cluster size. The cluster information includes a storage location in the NAND 10B at which cluster data is stored (logical block number and intra-logical-block storage location at which cluster data is stored) and a cluster valid/invalid flag indicating whether the cluster is valid or invalid.

As shown in FIG. 13, in the logical block management table 22B managed in the RAM 20B, the correspondence relationship between the logical block number, block configuration information indicating identification information on a plurality of physical blocks configuring this logical block (in this embodiment, 32 physical blocks), defect information, error information, used/unused information, and an invalid flag indicating whether the logical block can be used or cannot be used is registered. In the block configuration information, the numbers of 32 physical blocks configuring a logical block are registered in units of slots. The physical block number can be specified by slot number+chip number+intra-chip physical block number.

The defect information includes a defect flag Fk, a defective slot Sk, and the number of defective blocks Nk. The defect flag Fk identifies whether 32 physical blocks are all present, that is, whether there is a defective physical block. The defective slot Sk indicates a defective slot position. The number of defective blocks Nk indicates the number of defective physical blocks in a logical block. In the defective slot Sk, when the number of defective slots is one, one piece of slot information is registered, and, when the number of defective slots is n, n pieces of slot information are registered.

In the error information, the presence or absence of occurrence of an error, and error position information indicating a slot position at which an error occurs are registered. The error information is updated when an error, such as a write error, a read error, and an erase error, occurs.

The used/unused information identifies whether each logical block is in use, that is, whether each logical block is a free block FB or an active block AB. A free block FB is an unused block which does not include valid data therein and to which a use is not allocated. An active block AB is a used block which includes valid data therein and to which a use is allocated. With the use of the used/unused information, a free block FB used when writing is performed on the NAND 10B can be selected. A free block FB includes both a block on which writing has never been performed and a block on which writing is performed once and in which all the written data thereafter becomes invalid data. Erasing is performed on a free block FB at a predetermined timing before the free block FB is used as an active block AB.

In the SSD 100B, a logical-physical dynamic translation method is used in which the relationship between a logical address (LBA) and a physical address (storage location in the NAND 10B) is not statically predetermined and a logical address and a physical address are dynamically associated with each other when data writing is performed. For example, when data is overwritten in the same LBA, the following processing is performed. Assume that valid data of the block size is stored in a logical address A1 and a block B1 is used as a storage area. When a command to overwrite update data of the block size in the logical address A1 is received from the host 1B, one free block FB (referred to as a block B2) is reserved and the data received from the host 1B is written in the free block FB. Thereafter, the logical address A1 is associated with the block B2. Consequently, the block B2 becomes an active block AB and the data stored in the block B1 becomes invalid, therefore, the block B1 becomes a free block FB.

FIG. 14 illustrates a bad block table 26B managed in the RAM 20B. In the bad block table 26B, a congenital bad block and an acquired bad block are registered. In the bad block table 26B, for example, the physical block number indicating a bad block (for example, channel number+bank number+chip number+intra-chip physical block number) is registered. A congenital bad block may be managed not to be registered in the bad block table 26B.

In FIG. 9, the NANDC 31B includes a NAND interface that performs interface processing with the NAND 10B, a DMA (Direct Memory Access) controller, and the like, and writes data temporarily stored in the RAM 20B to the NAND 10B and reads and transfers data stored in the NAND 10B to the RAM 20B. The NANDC 31B includes an ECC (Error Correcting Code) circuit 39B. The ECC circuit 39B performs encoding processing in ECC processing (error correction processing) on data to be written in the NAND and adds the encoding result to data and outputs it. Moreover, the ECC circuit 39B performs decoding processing in the ECC processing (error correction processing using an error-correcting code) on data read from the NAND 10B and outputs error corrected data. In the decoding processing, when it is determined that miscorrection occurs, that is, when an error equal to or higher than the correction capability of an ECC code occurs, the ECC circuit 39B notifies the controller 30B accordingly. When the controller 30B receives the notification of miscorrection from the ECC circuit 39B, the controller 30B updates the error information in the logical block management table 22B.

The controller 30B includes a read/write control unit 32B, an organizing unit 33B, and a block managing unit 34B.

The read/write control unit 32B performs processing of writing data to be written in the NAND 10B to the NAND 10B via a work area of the write buffer 25B of the RAM 20B or the RAM 20B and read processing from the NAND 10B. Moreover, the read/write control unit 32B performs update processing of the management table, such as the address translation table 21B and the logical block management table 22B, with a write operation to the NAND 10B.

The block managing unit 34B performs the construction processing of a logical block described above when the power is turned on for the first time in the manufacturing stage and updates the defect information and the error information in the logical block management table 22B with the subsequent generation of an acquired bad block. Moreover, the block managing unit 34B performs reconstruction processing of a logical block also when the SSD 100B is used.

The organizing unit 33B performs data organizing (compaction) in the NAND 10B. In the SSD 100B, when a data erasing unit (block) is different from a data management unit, according to the progress of rewriting of the NAND 10B, blocks are made porous due to invalid (non-latest) data. When blocks in such a porous state increase, substantially usable blocks decrease and a storage area of the NAND 10B cannot be effectively used. Therefore, for example, when the number of free blocks of the NAND 10B becomes less than a predetermined threshold, the NAND 10B is organized, for example, by performing the compaction or garbage collection of collecting valid clusters in logical blocks and rewriting them in a different logical block, thereby reserving a free block to which a use is not allocated. The organizing unit 33B performs update processing on the management table, such as the address translation table 21B and the logical block management table 22B, with the execution of the compaction.

FIG. 15 is a diagram illustrating a construction procedure of a logical block when the power is turned on for the first time in the manufacturing stage. When the power is turned on for the first time in the manufacturing stage, the block managing unit 34B performs the construction processing of a logical block by using physical blocks excluding unusable blocks and registers the construction result in the logical block management table 22B. Unusable blocks include an initial (congenital) bad block, a fixed management area (physical block in which firmware for allowing to function as the controller 30B is stored), a static partition block (physical block in which manufacturing information or the like is stored), and the like, and information indicating the unusable block number (referred to as unusable block information) is, for example, registered in the static partition block in advance. A logical block constructed in the manufacturing stage is continuously used without change also when a user thereafter uses the SSD 100B. However, if an acquired bad block is generated when a user thereafter uses the SSD 100B, the defect information, the error information, and the like in the logical block management table 22B are updated according to the occurrence status.

The block managing unit 34B registers information indicating a congenital bad block in the unusable block information in the bad block table 26B. The block managing unit 34B sequentially generates a full logical block composed of 32 physical blocks by selecting one usable physical block excluding unusable physical blocks from each of the Slot 0 to Slot 31 on the basis of the unusable block information (Step S100B). The block managing unit 34B registers the management information relating to the generated full logical blocks in the logical block management table 22B. These full logical blocks are usable logical blocks, therefore, an invalid flag in the logical block management table 22B is set off.

Next, the block managing unit 34B generates a defect 1 logical block composed of 31 physical blocks by selecting one physical block excluding unusable physical blocks and physical blocks used as full logical blocks from each of the 31 slots on the basis of the unusable block information (Step S110B). The block managing unit 34B registers the management information relating to the generated defect 1 logical blocks in the logical block management table 22B. This defect 1 logical block is a usable logical block, therefore, an invalid flag in the logical block management table 22B is set off.

Next, the block managing unit 34B generates a defect 2 logical block composed of 30 physical blocks by selecting one physical block excluding unusable physical blocks, physical blocks used as full logical blocks, and physical block used as defect 1 logical blocks from each of the 30 slots on the basis of the unusable block information (Step S120B). The block managing unit 34B registers the management information relating to the generated defect 2 logical blocks in the logical block management table 22B. This defect 2 logical block is an unusable logical block, therefore, an invalid flag in the logical block management table 22B is set on.

Next, the block managing unit 34B manages a remaining usable physical block that does not belong to any of a full logical block, a defect 1 logical block, and a defect 2 logical block as a remaining physical block.

Figure 16:
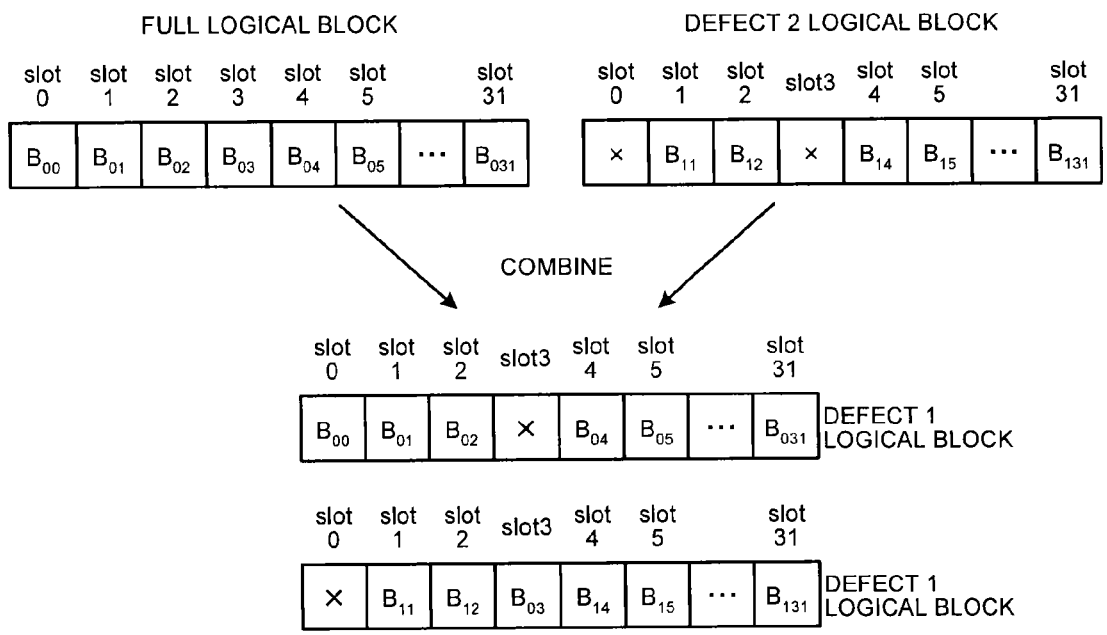
FIG. 16 is a diagram conceptually illustrating reconstruction of a logical block.

Next, the block managing unit 34B performs reconstruction of a logical block by generating two defect 1 logical blocks by using a full logical block and a defect 2 logical block (Step S130B). FIG. 16 illustrates one example of this reconstruction. As shown in FIG. 16, the slot 0 and the slot 3 are defective in a defect 2 logical block. The physical block B03 of the slot 3 of the full logical block is allocated to the slot 3 of the defect 2 logical block, thereby generating two defect 1 logical blocks. Consequently, a usable logical block can be increased from one (full logical block) to two (defect 1 blocks). With this reconstruction, the logical block management table 22B is updated.

In this embodiment, defect 1 logical blocks are generated from one defect 2 logical block and one full logical block, however, three defect 1 logical blocks can be generated from one defect 3 logical block and two full logical blocks by applying this method. In other words, it is possible to generate M defect 1 logical blocks from one defect M logical blocks and (M-1) full logical blocks. If the number of defective logical blocks is increased, the performance of the SSD is adversely affected and a bad block is easily generated, therefore, M is determined in consideration of the reliability.

Figure 17:
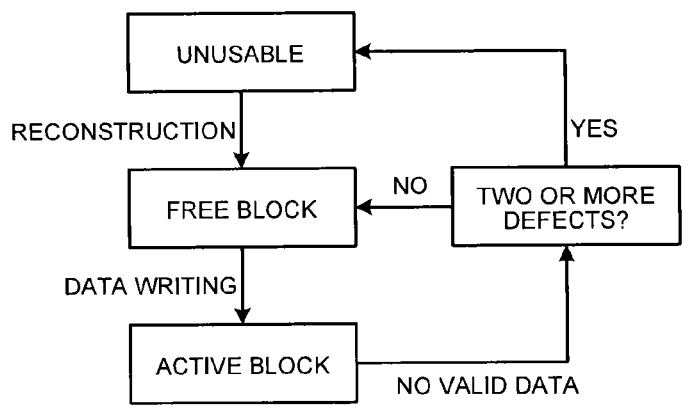
FIG. 17 is a diagram illustrating a life cycle of a logical block.

FIG. 17 illustrates a life cycle of a logical block when the SSD 100B is used. A usable logical block composed of a full logical block or a defect 1 logical block is first in a state of a free block in which data is unwritten, and, after the erase processing, data is written in the logical block to be an active block.

Thereafter, for example, writing, such as overwriting of data in the same LBA, or the compaction is performed, whereby an active block falls into a state where only invalid (non-latest) data is stored. When an active block falls into a state where only invalid data is stored therein, it is determined whether the number of defects becomes two or more. A logical block in which the number of defects becomes two or more becomes an unusable logical block by setting the invalid flag in the logical block management table 22B on, and a logical block in which the number of defects is one or less returns to a free block. In other words, when the erase processing, data reading, or data writing, or the like is performed, an acquired bad block is generated in some cases. Therefore, when two or more defects are generated in a full logical block or a defect 1 logical block, the logical block becomes unusable. A physical block in a logical block which becomes unusable and in which the number of defects is two or more is thereafter reused to be used for reconstructing a logical block and returns to a physical block configuring a free block (full logical block or defect 1 logical block) in some cases.

Figure 18:
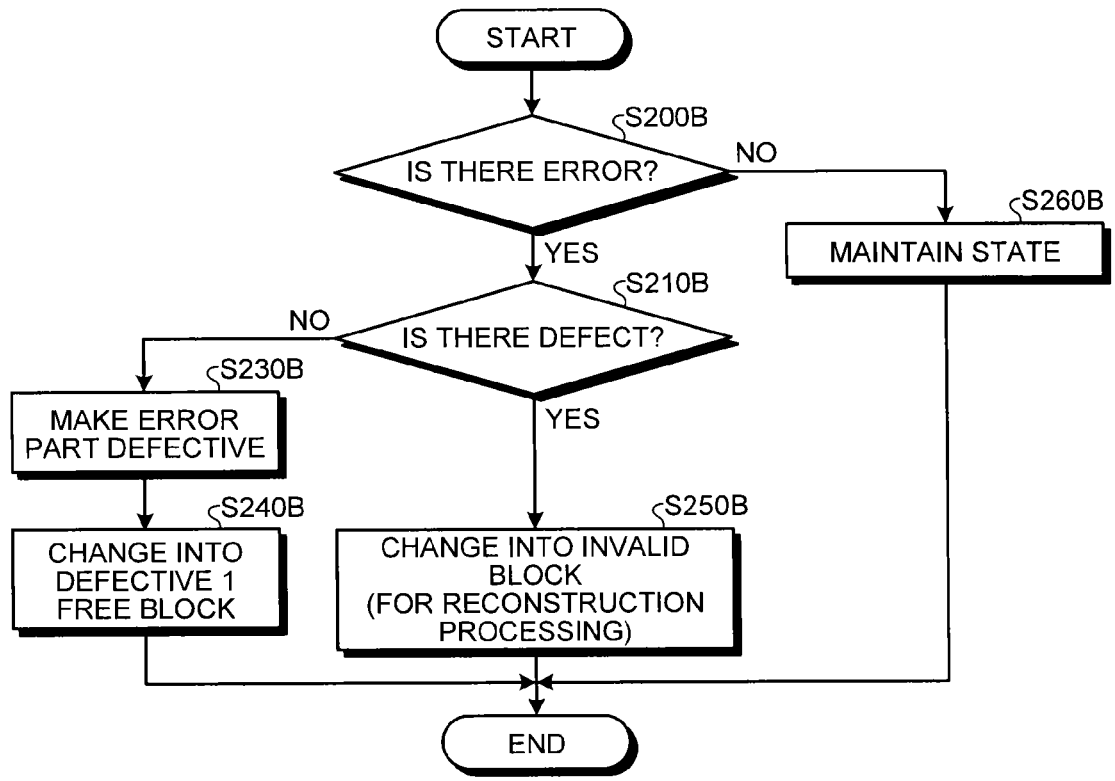
FIG. 18 is a flowchart illustrating a detailed procedure of determination processing.

FIG. 18 is a flowchart illustrating a detailed procedure of the determination processing shown in FIG. 17. The block managing unit 34B performs the following determination processing before a logical block transitions from an active block to a free block. The block managing unit 34B determines whether an error occurs by referring to the error information in the logical block management table 22B (Step S200B). As described above, when the erase processing, the data reading, the data writing, or the like is performed before a free block becomes an active block in which only invalid data is stored, if an acquired bad block is generated, the error information in the logical block management table 22B is updated according to the occurrence status.

For a logical block in which an error does not occur in the determination in Step S200B, the block managing unit 34B changes the used/unused information in the logical block management table 22B to "unused" to change the logical block to a free block. In other words, a full logical block is maintained to be a full logical block and a defect 1 logical block is maintained to be a defect 1 logical block (Step S260B).

For a logical block in which an error occurs in the determination in Step S200B, the block managing unit 34B next determines whether the logical block already has a defect by referring to the defect information (defect flag Fk) in the logical block management table 22B (Step S210B). If there is a defect, the number of defects accordingly becomes two or more because of the error and the defect, therefore, the block managing unit 34B sets the invalid flag in the logical block management table 22B from off to on to change the logical block to an unusable logical block. The unusable logical block having two or more defects is thereafter used for reconstruction of a logical block (Step S250B).

For a logical block that is determined to have no defect in the determination in Step S210B, the block managing unit 34B updates the defect information with the content of the error information in the logical block management table 22B and updates the error information to indicate that there is no error (Step S230B). Then, the block managing unit 34B changes the used/unused information in the logical block management table 22B to "unused" to change the logical block to a defect 1 free block (Step S240B).

Figure 19:
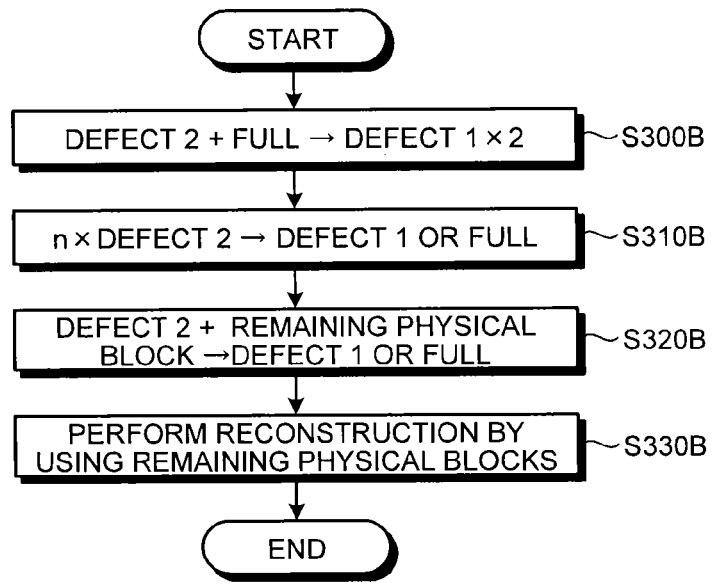
FIG. 19 is a flowchart illustrating a reconstruction procedure of a logical block when an SSD is used.

FIG. 19 is a flowchart illustrating a reconstruction procedure of a logical block when the SSD 100B is used. At an appropriate point, such as when the number of free blocks becomes lower than a predetermined threshold or when a defect 2 logical block is newly generated, the block managing unit 34B performs reconstruction of a logical block. As shown in FIG. 16, the block managing unit 34B first generates two defect 1 logical blocks by using a full logical block and a defect 2 logical block (Step S300B).

Next, the block managing unit 34B generates a full logical block or a defect 1 logical block by using a plurality of (two or more) defect 2 logical blocks (Step S310B). Next, the block managing unit 34B generates a full logical block or a defect 1 logical block by using remaining physical blocks that do not belong to any of a full logical block, a defect 1 logical block, and a defect 2 logical block, and a defect 2 logical block (Step S320B). Furthermore, the block managing unit 34B generates a full logical block or a defect 1 logical block by using a plurality of remaining physical blocks (Step S330B).

Figure 20:
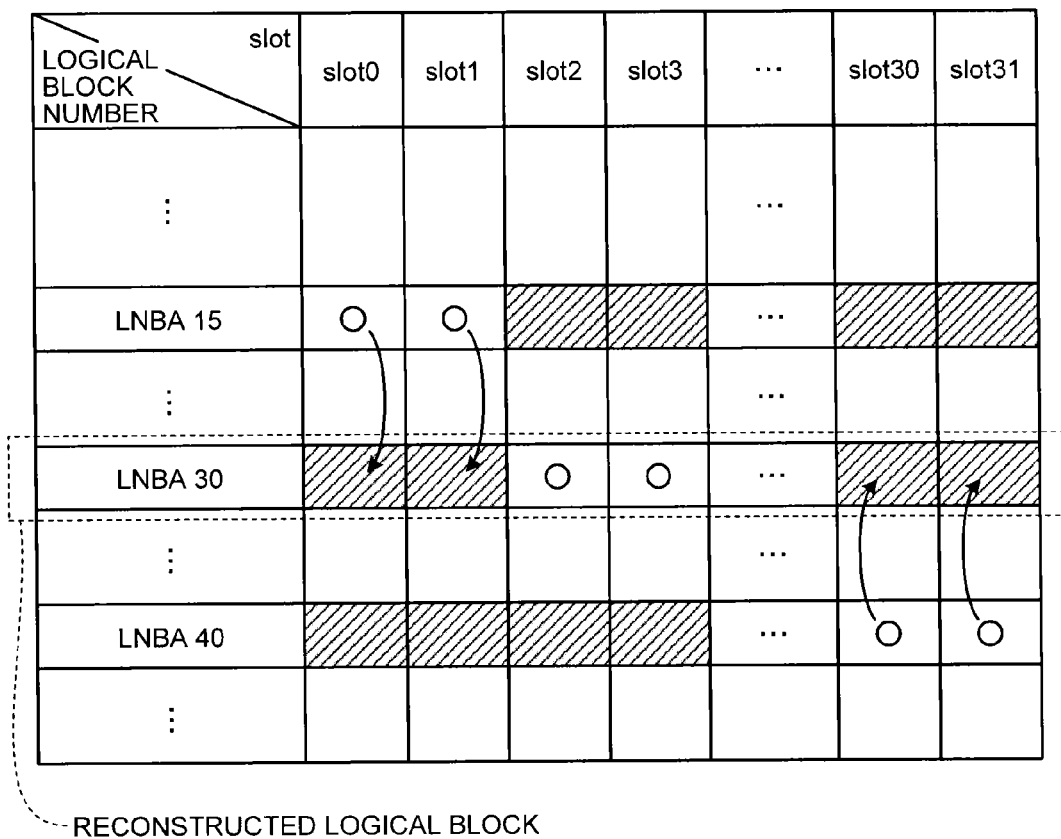
FIG. 20 is a diagram conceptually illustrating an example of reconstruction of a logical block when an SSD is used.

In FIG. 20, the construction processing of a logical block using a plurality of physical blocks (remaining physical blocks) included in unusable logical blocks having three or more defects is performed, thereby forming a new full logical block (logical BA30).

In this manner, in the present embodiment, when a logical block is constructed, an allowable value is set for the number of defective physical blocks, a logical block having defects the number of which does not exceed the allowable value is set usable, and a logical block having defects the number of which exceeds the allowable value is set unusable, therefore, it is possible to generate a logical block in which a certain degree of parallelism is ensured as many as possible. Moreover, the number of physical blocks configuring a logical block is not made fully variable and is allowed to vary within the allowable value, therefore, the management information that manages a logical block is simplified and is made light and thus the memory capacity used for the management information can be reduced.

Moreover, when the SSD is activated for the first time, the reconstruction processing of generating two defect 1 logical blocks by a defect 2 logical block and a full logical block is performed, therefore, the number of usable logical blocks generated when the SSD is activated for the first time can be increased. In other words, when a logical block is generated in the order of a full logical block, a defect 1 logical block, and a defect 2 logical block, a full logical block is generated as many as possible and thereafter a defect 1 logical block is generated as many as possible, therefore, when a defect 2 logical block is generated, there is no allocatable physical block in defective slots (slots in which a physical block is defective) of the defect 2 logical block. Thus, in the present embodiment, two usable defect 1 logical blocks are generated by using a full logical block and a defect 2 logical block by focusing on the fact that a physical block that fills a defective slot is present in a full logical block.

Moreover, when the SSD is used, a first reconstruction of generating two defect 1 logical blocks by using a defect 2 logical block and a full logical block, a second reconstruction of generating a defect 1 logical block or a full logical block by using a plurality of defect 2 logical blocks, a third reconstruction of generating a defect 1 logical block or a full logical block by using one to a plurality of defect 2 logical blocks and remaining physical blocks, and a fourth reconstruction of generating a defect 1 logical block or a full logical block by using a plurality of remaining physical blocks are performed, therefore, even when an acquired bad block is generated and the number of logical blocks decreases, the number of usable logical blocks can be increased.

In the present embodiment, as a parallel operation element, a channel and a bank are used, however, a plane may be used as a different parallel operation element. When a plane is used, for example, each memory chip is divided into two areas (Districts), i.e., a plane 0 and a plane 1, each of which includes a plurality of physical blocks. The plane 0 and the plane 1 include peripheral circuits independent from each other (e.g., a row decoder, a column decoder, a page buffer, and a data cache) and can simultaneously perform erasing, writing, and reading by using a plane double speed mode. Each memory chip may be divided into four or more planes.

When there are 8 channels, 4 banks, and 2 planes as parallel operation elements, up to 64 physical blocks can be operated in parallel. In this case, in a logical block, physical blocks may be combined in such a way that a channel parallel operation, a bank interleave, and a plane double speed mode can be performed. In other words, if the number of channels is 8, the number of planes is 2, and the number of banks is 4, a logical block is composed of up to 64 physical blocks. For performing the plane parallel operation, there is a constraint in some cases that a physical block of the plane 0 and a physical block of the plane 1 are in the same memory chip. If there is such a constraint, when a physical block of the plane 0 of a certain channel and a certain bank becomes a bad block, it is impossible to perform a plane double speed operation on a physical block of the plane 1 of the same channel and the same bank. Therefore, in such a case, a defect 1 logical block may be managed as a block including 62 physical blocks and a defect 2 logical block may be managed as a block including 60 physical blocks. In other words, when a physical block of the plane 0 of a certain channel and a certain bank becomes a bad block, a physical block of the plane 1 paired with this physical block is also managed as a bad block.

A logical block may be composed of only physical blocks for a plurality of channels, only physical blocks for a plurality of banks, or only physical blocks for a plurality of planes. Moreover, physical blocks may be combined in such a way that a channel parallel operation and a bank interleave can be performed, physical blocks may be combined in such a way that a channel parallel operation and a plane double speed operation can be performed, or physical blocks may be combined in such a way that a bank interleave and a plane double speed operation can be performed.

Fourth Embodiment

Next, an explanation is given of a method of achieving both the reliability when system data is multiplexed and the long life while ensuring the capacity of an area used as user data and the performance as much as possible in the logical block construction processing.

Figure 21:
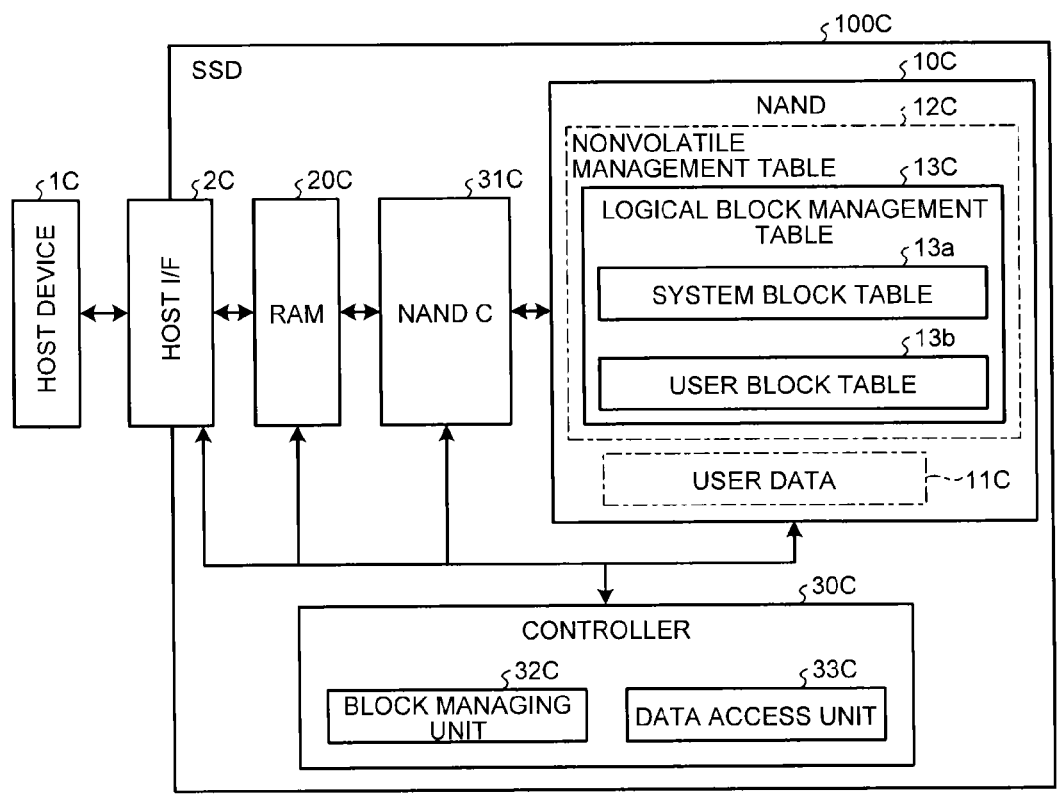
FIG. 21 is a block diagram illustrating an internal configuration example of an SSD according to a fourth embodiment.

FIG. 21 is a block diagram illustrating a configuration example of an SSD (Solid State Drive) 100C according to the fourth embodiment. The SSD 100C is connected to a host device (hereinafter, host) 10, such as a personal computer or a CPU, via a host interface 2C, such as an ATA interface (ATA I/F), and functions as an external storage device of the host 10. Examples of the host 10 include a CPU of a personal computer and a CPU of an imaging device, such as a still camera and a video camera. The SSD 100C includes the host interface 2C, a NAND flash memory (hereinafter, NAND) 100 that is a nonvolatile semiconductor memory, a RAM 20C that is a semiconductor memory capable of performing a high-speed access compared with the NAND 100, a NAND controller (NANDC) 31C, and a controller 30C.

The NAND 100 stores therein user data 11C specified by the host 10 and management information managed in the RAM 20C for backup as a nonvolatile management table 12C. The NAND 100 includes a memory cell array in which a plurality of memory cells is arrayed in a matrix manner, and each memory cell is capable of multi-value recording by using an upper page and a lower page. The NAND 100 includes a plurality of memory chips and each memory chip is configured by arraying a plurality of physical blocks such that one physical block is one unit for data erasing. In the NAND 100, writing and reading of data is performed in units of physical pages. A physical block consists of a plurality of physical pages.

Figure 22:
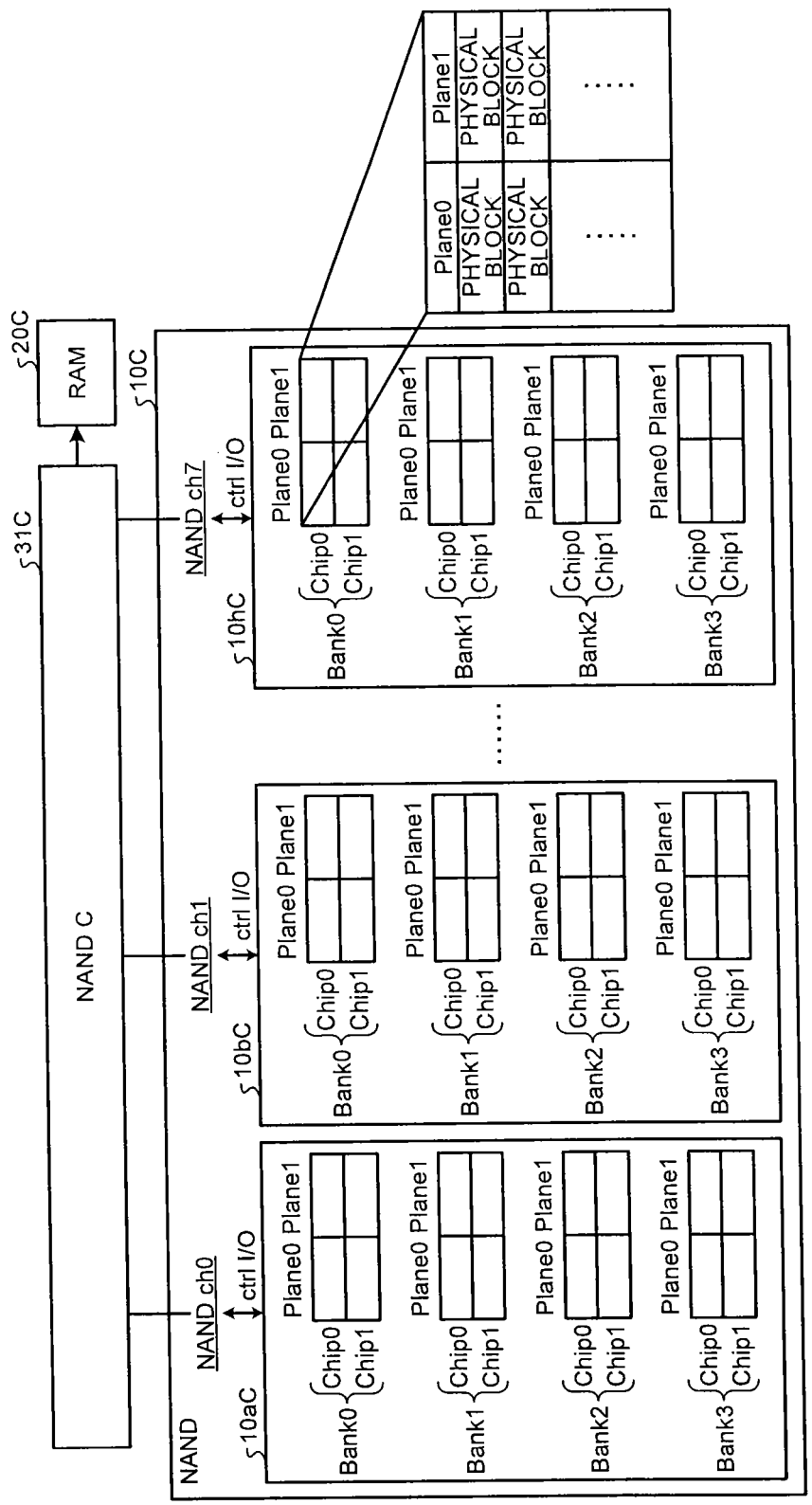
FIG. 22 is a diagram illustrating an internal configuration example of a NAND according to the fourth embodiment.

FIG. 22 illustrates a detailed configuration example of the NAND 100 according to the fourth embodiment. In this embodiment, the NAND 100 is connected to the NAND controller (NANDC) 31C via eight channels (8ch: ch0 to ch7) in parallel and therefore can operate eight channel parallel operation elements 10*a*C to 10*h*C in parallel. The number of channels is not limited to eight and any number can be arbitrary employed. Each of the parallel operation elements 10*a*C to 10*h*C includes a plurality of banks (in this case, four banks (Bank0 to Bank3)) capable of performing a bank interleave. Each bank includes a plurality of memory chips (in this case, two memory chips (Chip0 and Chip1)). Each memory chip is, for example, divided into two areas (Districts), i.e., a plane 0 and a plane 1, each of which includes a plurality of physical blocks. The plane 0 and the plane 1 include peripheral circuits independent from each other (e.g., a row decoder, a column decoder, a page buffer, and a data cache) and can simultaneously perform erasing, writing, and reading by using a plane double speed mode. In this manner, each memory chip of the NAND 100 can perform a parallel operation by a plurality of channels, a bank interleave operation by a plurality of banks, and a parallel operation by a plurality of planes. Each memory chip may be divided into four planes or may be configured without being divided.

In this manner, in the NAND 100, a parallel operation by a plurality of channels, a parallel operation by a plurality of banks, and a parallel operation by a double speed mode using a plurality of planes can be performed. When the number of channels is 8, the number of banks is 4, and the number of planes is 2, up to 64 physical blocks can be operated in parallel.

The RAM 20C functions as a storage area as a write buffer for temporarily storing data when the data from the host 10 is written to the NAND 100, a storage area for storing and updating management information, such as the nonvolatile management table 12C, a work area for temporarily storing data read from the NAND 100, and the like.

When the host 10 outputs a read request or a write request to the SSD 100C, the host 10 inputs an LBA (Logical Block Addressing) as a logical address to the SSD 100C via the host interface 2C. An LBA is a logical address in which serial numbers starting from zero are attached to sectors (size: for example, 512 B).

In the SSD 100C, as a unit for collectively managing a plurality of physical blocks, a virtual block, which is referred to as a logical block, is defined. In this embodiment, a logical block is formed by combining physical blocks in such a way that a channel parallel operation, a bank interleave, and a plane double speed operation can be performed. In other words, a logical block is composed of physical blocks the number of which is determined by the number of channels× the number of banks×the number of planes. As shown in FIG. 22, if the number of channels is 8, the number of planes is 2, and the number of banks is 4, a logical block is composed of up to 64 physical blocks.

A logical block may be composed of only physical blocks for a plurality of channels, only physical blocks for a plurality of banks, or only physical blocks for a plurality of planes. Moreover, physical blocks may be combined in such a way that a channel parallel operation and a bank interleave can be performed, physical blocks may be combined in such a way that a channel parallel operation and a plane double speed operation can be performed, or physical blocks may be combined in such a way that a bank interleave and a plane double speed operation can be performed.

In FIG. 21, the nonvolatile management table 12C is a table that manages system data that is management information used in the SSD 100C and includes a logical-physical translation table (not shown) that manages a correspondence between an LBA as a logical address specified in the host 1C and a physical address indicating the storage location of data in the NAND 100, a logical block management table 13C that manages a logical block, and the like. The logical block management table 13C includes a system block table 13*a* that manages a logical block in which system data (the nonvolatile management table 12C) is stored and a user block table 13b that manages a logical block in which user data is stored.

In this embodiment, as described above, a logical block for user data (hereinafter, referred to as user logical block) is composed of up to 64 physical blocks. In a logical block for system data (hereinafter, referred to as system logical block), the amount of writing is normally smaller than user data, therefore, a system logical block is made smaller in size (the number of physical blocks) than a user logical block. A system logical block may be composed of a plurality of physical blocks, however, in this embodiment, a system logical block is composed of one physical block.

FIG. 23 illustrates the system block table 13a. In the system block table 13a, the correspondence between the logical block number, configuring block information indicating the physical block number (one in this embodiment) configuring a logical block, and management information such as used/unused information is managed. The used/unused information identifies whether each logical block is in use, that is, whether each logical block is a free block FB or an active block AB. A free block FB is an unused block which does not include valid data therein and to which a use is not allocated. An active block AB is a block in use which includes valid data therein and to which a use is allocated.

FIG. 24 illustrates the user block table 13b. In the user block table 13b, the correspondence between the logical block number, configuring block information indicating a plurality of physical block numbers (64 in this embodiment) configuring a logical block, and management information such as used/unused information is managed. The user block table 13b and the system block table 13a may be managed in the same table.

In FIG. 21, the NANDC 31C includes a NAND I/F that performs interface processing with the NAND 100, an error correction circuit, a DMA controller, and the like and writes data temporarily stored in the RAM 20C to the NAND 100 and reads and transfers data stored in the NAND 100 to the RAM 20C on the basis of the control of the controller 30C.

The function of the controller 30C is implemented by a system program (firmware) stored in the NAND 100 and a processor that executes this firmware. The controller 30C includes a data access unit 33C and a block managing unit 32C. The data access unit 33C performs write processing to the NAND 100 via a write buffer, read processing from the NAND 100, data organizing (compaction) in the NAND 100, and the like. The compaction processing is processing of generating a new free block (logical block to which a use is not allocated) by collecting valid data in logical blocks and rewriting them to a different logical block.

Figure 25:
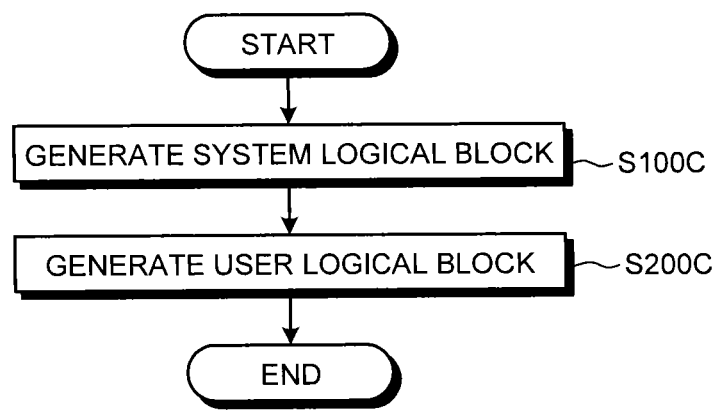
FIG. 25 is a flowchart illustrating a construction procedure of a logical block.

When the power is turned on for the first time in the manufacturing stage, the block managing unit 32C performs the construction processing of a logical block and registers the construction result in the configuring block information in the logical block management table 13C. FIG. 25 illustrates the entire procedure of the construction processing of a logical block. In the manufacturing stage, when the power is turned on for the first time, the block managing unit 32C first constructs system logical blocks (Step S100C) and thereafter constructs user logical blocks (Step S200C).

System logical blocks are constructed as follows. System logical blocks are selected from physical blocks excluding unusable blocks. Unusable blocks include an initial (congenital) bad block, a fixed management area (physical block in which firmware for allowing to function as the controller 30C is stored), a static partition block (physical block in which manufacturing information or the like is stored), and the like, and the information indicating the unusable block number is, for example, registered in the static partition block in advance. A logical block constructed in the manufacturing stage is continuously used without change also when a user thereafter uses the SSD 100C.

In this embodiment, a system logical block is multiplexed (in this embodiment, an example of duplexing is illustrated), thereby ensuring the reliability. For duplexing a system logical block, the NAND 100 is divided into two groups, that is, a group A and a group B. For improving the reliability of duplexing, a physical block belonging to the group B and a physical block belonging to the group A are obtained from different memory chips. Therefore, a physical block belonging to the group A and a physical block belonging to the group B are obtained from different channels.

Figure 26:
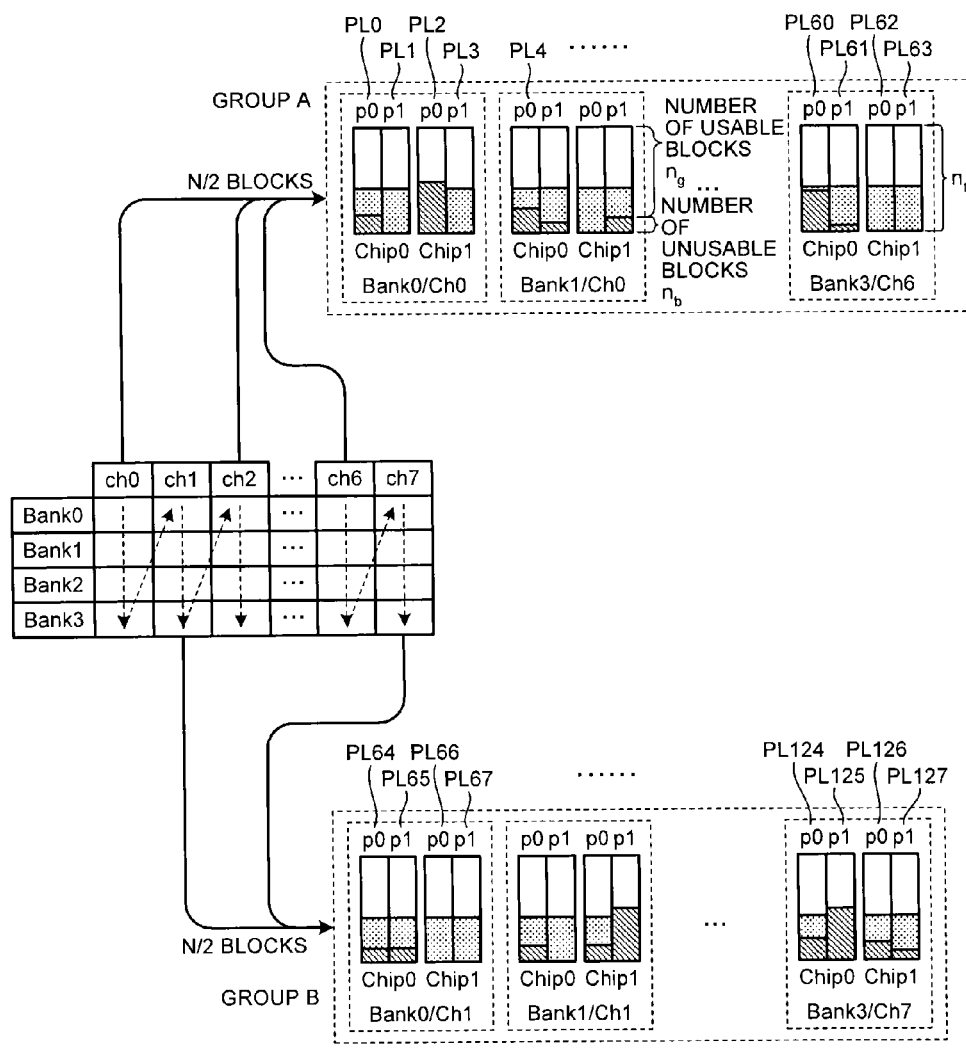
FIG. 26 is a diagram conceptually illustrating selection processing of a system block in the fourth embodiment.
Figure 27:
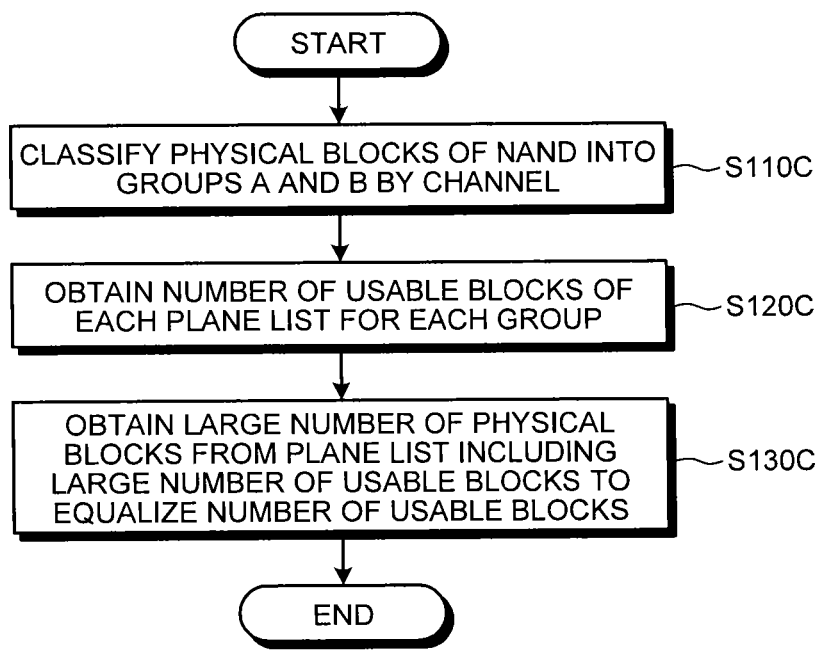
FIG. 27 is a flowchart illustrating a construction procedure of a system logical block.

FIG. 26 is a diagram conceptually illustrating selection processing of system blocks in the fourth embodiment. FIG. 27 is a flowchart illustrating a selection procedure of system blocks. As shown in FIG. 26, in the block managing unit 32C, physical blocks of the NAND 10C are grouped, for example, by configuring the group A by even-numbered channels (ch0, ch2, ch4, and ch6) and configuring the group B by odd-numbered channels (ch1, ch3, ch5, and ch7) (FIG. 27: Step S110C). When a total of N system blocks are reserved, N/2 physical blocks are selected from the group A and N/2 physical blocks are selected from the group B.

Moreover, the block managing unit 32C classifies physical blocks in a group into a plurality of classification units for each group such that one classification unit indicates the same channel, the same bank, the same chip, and the same plane. This classification unit is referred to as a plane list. Consequently, as shown in FIG. 26, the group A includes 64 plane lists (PL0 to PL63) by classification by 4 channels (ch0, ch2, ch4, and ch6), 4 banks (Bank 0 to Bank 3), 2 chips (Chip 0 and Chip 1), and 2 planes (Plane 0 and Plane 1). In FIG. 26, the plane 0 is described as p0, the plane 1 is described as p1, and the plane list 0 to the plane list 63 are described as PL0 to PL63.

In a similar manner, the group B includes 64 plane lists (PL64 to PL127) by classification by 4 channels (ch1, ch3, ch5, and ch7), 4 banks (Bank 0 to Bank 3), 2 chips (Chip 0 and Chip 1), and 2 planes (Plane 0 and Plane 1).

Next, the block managing unit 32C calculates the number of usable blocks ng of each plane list by subtracting the number of unusable blocks nb from the total number of physical blocks nt for each plane list of the group A (Step S1200). FIG. 26 illustrates unusable blocks by a downward-sloping hatching. The block managing unit 32C selects N/2 physical blocks from the group A by referring to the number of usable blocks ng (or the number of unusable blocks nb) of each plane list and registers the selected blocks in the system block table 13a as system blocks.

When the block managing unit 32C selects N/2 physical blocks, the block managing unit 32C preferentially selects a large number of physical blocks from a plane list including a large number of usable blocks and selects a small number of physical blocks from a plane list including a small number of usable blocks so that the number of usable blocks ng is equalized between the plane lists after selection (Step S1300). In other words, physical blocks are not equally selected from each plane list in the group A. In a similar manner, in the group B, N/2 physical blocks are selected and the selected physical blocks are set in the system block table 13a as system blocks.

In FIG. 26, the selected system blocks are represented by a dot array. Physical blocks are preferentially selected from a plane list having a large number of usable blocks, therefore, the number of usable blocks excluding the selected system blocks and unusable blocks is equalized in each plane list.

When system blocks are selected from a chip, it is desirable to select a physical block arranged near the central position in the chip. This is because it is empirically known that a physical block located near the central position in a chip has higher reliability.

The block managing unit 32C performs the construction processing of user logical blocks by using physical blocks other than system blocks and unusable blocks. In the construction of user logical blocks, one physical block is selected from each of 64 plane lists among 128 plane lists (PL0 to PL127) and one logical block is constructed by the selected 64 physical blocks in such a way that a channel parallel operation, a bank interleave, and a plane double speed operation can be performed. 64 physical blocks are selected from 128 plane lists regardless of the grouping (groups A and B) of system data. For example, among four plane lists PL0 to PL3 belonging to the Bank0/Ch0, one physical block is selected from the plane lists PL0 and PL2 belonging to the plane 0 and one physical block is selected from the plane lists PL1 and PL3 belonging to the plane 1. Such selection processing is repeated for PL4 to PL7, . . . , and PL124 to PL127, thereby constructing one logical block.

Then, the block managing unit 32C constructs a plurality of logical blocks by repeating such processing. When system logical blocks are constructed, the number of usable blocks in each plane list is equalized, therefore, a larger number of user logical blocks can be reserved.

In this manner, in the fourth embodiment, first, a system logical block construction is performed in such a way to preferentially select physical blocks from a plane list including a large number of usable blocks to equalize the number of usable blocks in each plane list and multiplex system blocks, and thereafter, a user logical block construction is performed, therefore, it is possible to reserve a logical block for user data in which a predetermined parallelism is ensured as many as possible while ensuring the reliability of system data. Moreover, because system logical blocks are constructed before user logical blocks, system blocks can be selected from any position in a chip and system blocks can be concentrated at a central position in a chip having higher reliability.

Fifth Embodiment

In this fifth embodiment, when two physical blocks are selected from four plane lists in a Bank/Channel unit for constructing a user logical block, a constraint is provided in which the plane 0 and the plane 1 are selected from the same chip. For example, in FIG. 26, when two physical blocks are selected from four plane lists PL0 to PL3 belonging to the Bank0/Ch0, one physical block is selected from each of the plane list PL0 belonging to the Chip0/plane0 and the plane list PL1 belonging to the Chip0/plane1 or from each of the plane list PL2 belonging to the Chip1/plane0 and the plane list PL3 belonging to the Chip1/plane1.

Such a constraint is provided, therefore, in the fifth embodiment, the following selection processing of system blocks is performed. In a similar manner to the fourth embodiment, physical blocks of the NAND 10C are grouped into the groups A and B and N/2 physical blocks are reserved from each group. In the following, an explanation is given of a procedure of selecting N/2 physical blocks from the group A composed of even-numbered channels (ch0, ch2, ch4, and ch6).

First, the block managing unit 32C derives the number of usable block sets Ng for each Bank/Channel unit. As shown in FIG. 26, a Bank/Channel unit is a set of physical blocks that includes four plane lists (PL0 to PL3, PL4 to PL7, . . . , or PL60 to PL63) and has the same bank number and the same channel number. The number of usable block sets Ng is a value obtained by summing the smaller number of usable blocks between the plane 0 and the plane 1 in the chips included in a Bank/Channel unit. For example, when the number of usable blocks is 10 in Chip0/plane0, 7 in Chip0/plane1, 12 in Chip1/plane0, and 9 in Chip1/plane1, the number of usable block sets is 7 in Chip0 and 9 in Chip1 and the number of usable block sets Ng in a Bank/Channel unit becomes 16.

Figure 28:
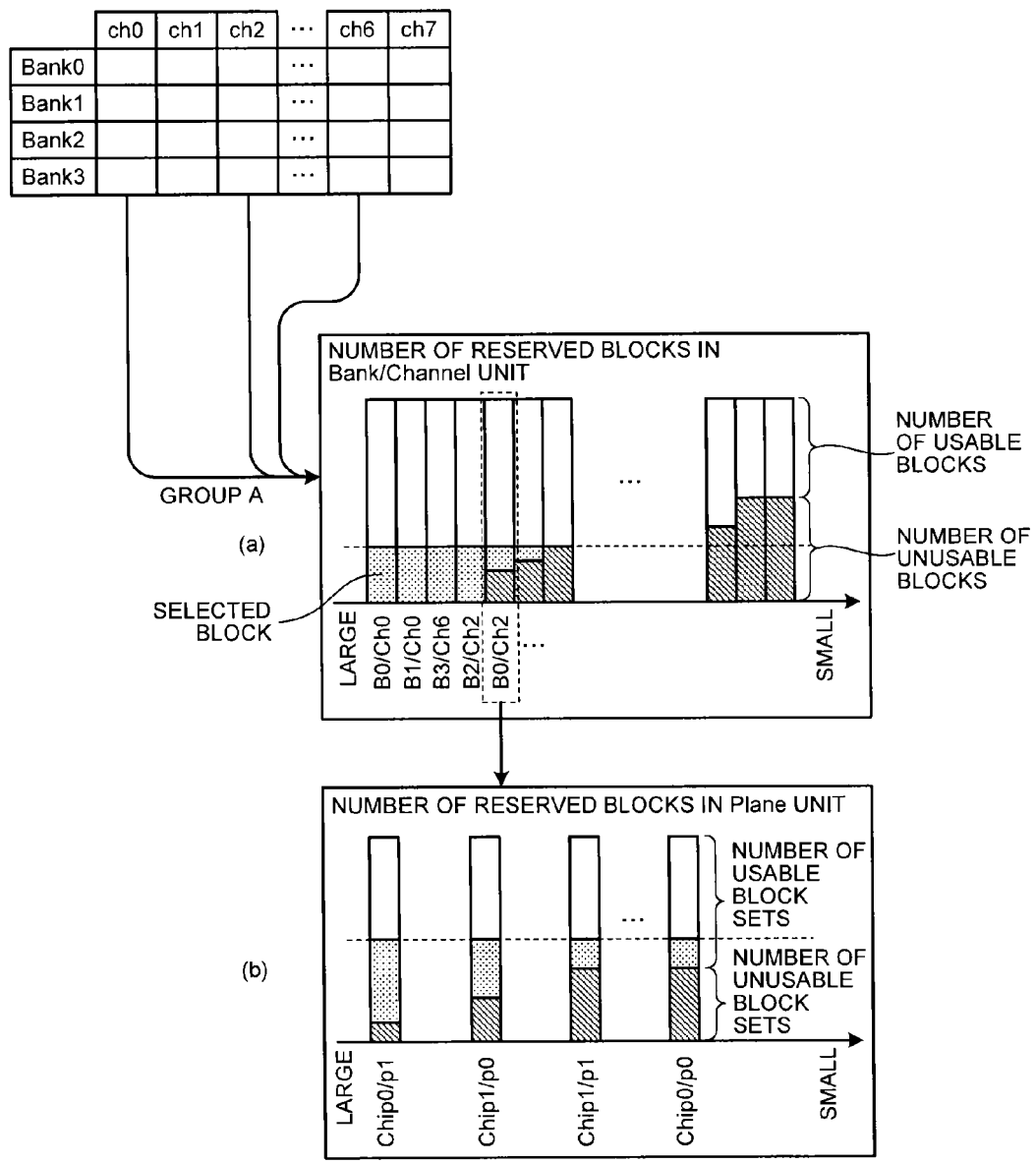
FIG. 28 is a diagram conceptually illustrating selection processing of a system block in a fifth embodiment.

In this manner, after deriving the number of usable block sets Ng for each Bank/Channel unit, the block managing unit 32C sorts the Bank/Channel units in descending order of the number of usable block sets Ng in a Bank/Channel unit. FIG. 28A illustrates a state where the Bank/Channel units are sorted in descending order of the number of usable block sets Ng. Next, as shown in FIG. 28A, the block managing unit 32C reserves (selects) physical blocks while prioritizing a Bank/Channel unit in which the number of usable block sets is large so that the number of usable block sets is equalized over all the Bank/Channel units.

When the number of usable block sets is reserved for each Bank/Channel unit, the block managing unit 32C distributes the reserved blocks for each Bank/Channel unit to each plane list of a corresponding Bank/Channel unit. In a Bank/Channel unit, as shown in FIG. 28B, physical blocks are preferentially reserved (selected) from a plane list including a large number of usable blocks.

Moreover, in a Bank/Channel unit, as shown in FIG. 28B, physical blocks are selected in such a way to correct a deviation in the number of usable blocks between the plane 0 and the plane 1 in the same chip, that is, to equalize the number of usable blocks between the plane 0 and the plane 1 in the same chip. In other words, when there is a deviation in the number of usable blocks between the plane 0 and the plane 1 in the same chip, physical blocks are preferentially selected from a plane including a large number of usable blocks out of the plane 0 and the plane 1 so that the number of usable blocks is equalized between the plane 0 and the plane 1. When there is no deviation, physical blocks are equally selected from the plane 0 and the plane 1.

In this manner, in the fifth embodiment, in a Bank/Channel unit, system blocks are selected in such a way to correct a deviation in the number of usable blocks between the plane 0 and the plane 1 in the same chip, therefore, the number of usable blocks in each plane in the same chip is equalized. Consequently, when physical blocks are selected from a Bank/Channel unit for constructing user logical blocks, user logical blocks can be reserved as many as possible when a constraint is provided in which the plane 0 and the plane 1 are selected from the same chip.

Sixth Embodiment

Next, an explanation is given of a determination method capable of accurately performing a failure determination by block depletion even if the capacity of user data recordable in each logical block is different as explained in the above embodiment.

When the number of physical blocks configuring a logical block is fixed, the amount of user data recordable in one logical block is also fixed. In this number-of-blocks fixed system, when a logical block cannot be configured due to generation of a bad block (physical block that cannot be used as a storage area due to a large number of errors or the like) in a logical block, the recordable memory capacity of a flash memory decreases in units of logical blocks in terms of the system.

In this number-of-blocks fixed system, the usable memory capacity of a flash memory is defined according to logical blocks, therefore, it is possible to determine whether the storage area for the indicated capacity can be reserved only from the number of logical blocks.

On the other hand, the number of physical blocks configuring one logical block can be made variable. In this case, a defect of some of the physical blocks in a logical block due to generation of a bad block is allowed. When some of the physical blocks are defective, the amount of user data recordable in a logical block is reduced by the defective physical blocks. In other words, in the number-of-blocks variable system, the recordable memory capacity of a flash memory does not decrease in units of logical blocks in terms of the system.

In this manner, in the number-of-blocks variable system, the capacity of recordable user data is different in each logical block, therefore, it is not possible to determine whether the storage area for the indicated capacity can be reserved only from the number of logical blocks.

Thus, in the present embodiment, in addition to a first management unit that is a logical block, a second management unit, which is larger than the sector size and is equal to or smaller than the physical block size, is prepared, and it is determined whether the number of free blocks is insufficient on the basis of the first management unit and whether the storage area for the indicated capacity can be reserved on the basis of the second management unit. Consequently, even with the number-of-blocks variable system, depletion of blocks can be correctly determined and therefore the operation of the SSD can be continued to the limit.

Figure 29:
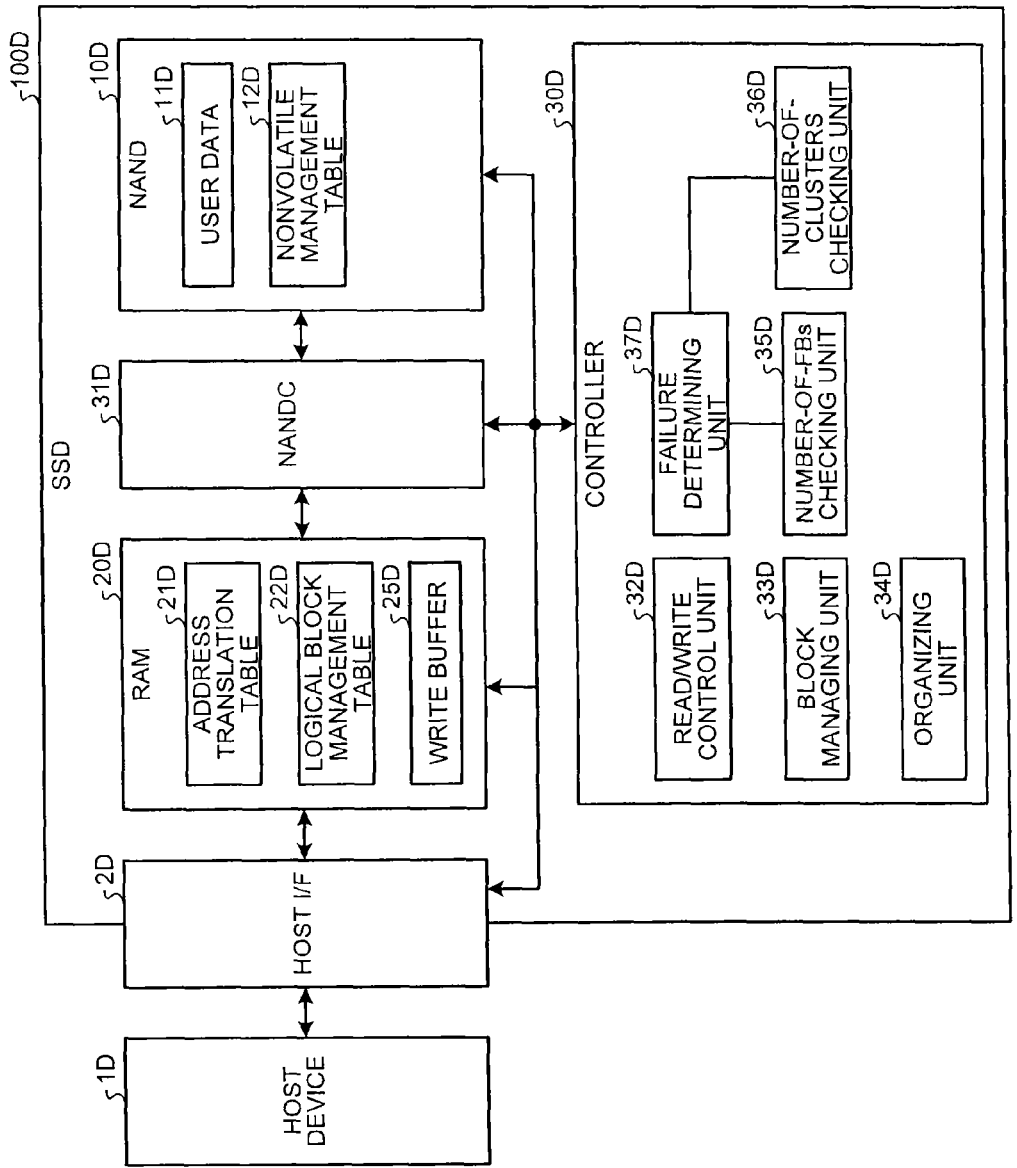
FIG. 29 is a block diagram illustrating an internal configuration example of an SSD according to a sixth embodiment.

FIG. 29 is a block diagram illustrating a configuration example of an SSD (Solid State Drive) 100D according to the sixth embodiment. The SSD 100D is connected to a host device (hereinafter, host) 1D, such as a personal computer or a CPU, via a host interface 2D, such as an ATA interface (ATA I/F), and functions as an external storage device of the host 1D. Examples of the host 1D include a CPU of a personal computer and a CPU of an imaging device, such as a still camera and a video camera. The SSD 100D includes the host interface 2D, a NAND flash memory (hereinafter, NAND) 10D that is a nonvolatile semiconductor memory, a RAM 20D that is a semiconductor memory capable of performing a high-speed access compared with the NAND 10D, a NAND controller (NANDC) 31D, and a controller 30D.

The NAND 10D stores therein user data 11D specified by the host 1D and management information managed in the RAM 20D for backup as a nonvolatile management table 12D. The NAND 10D includes a memory cell array in which a plurality of memory cells is arrayed in a matrix manner, and each memory cell is capable of multi-value recording by using an upper page and a lower page. The NAND 10D includes a plurality of memory chips and each memory chip is configured by arraying a plurality of physical blocks such that one physical block is one unit for data erasing. In the NAND 10D, writing and reading of data is performed in units of physical pages. A physical block consists of a plurality of physical pages.

Figure 30:
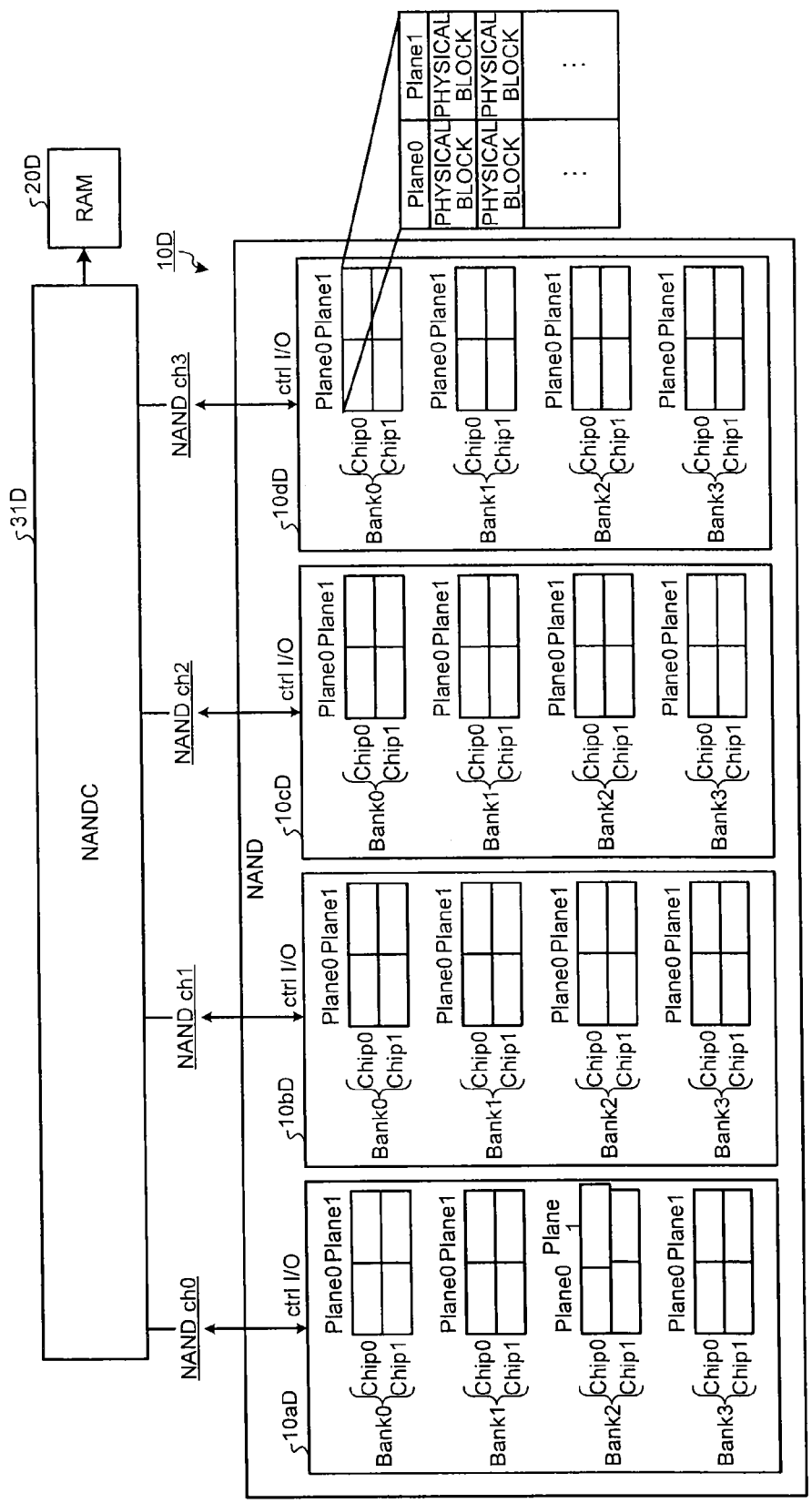
FIG. 30 is a diagram illustrating an internal configuration example of a NAND according to the sixth embodiment.

FIG. 30 illustrates a detailed configuration example of the NAND 10D according to the sixth embodiment. In this embodiment, the NAND 10D is connected to the NAND controller (NANDC) 31D via four channels (4ch: ch0 to ch3) in parallel and therefore can operate four channel parallel operation elements 10aD to 10dD in parallel. The number of channels is not limited to four and any number can be arbitrary employed. Each of the parallel operation elements 10aD to 10dD includes a plurality of banks (in this case, four banks (Bank0 to Bank3)) capable of performing a bank interleave. Each bank includes a plurality of memory chips (in this case, two memory chips (Chip0 and Chip1)). Each memory chip is, for example, divided into two areas (Districts), i.e., a plane 0 and a plane 1, each of which includes a plurality of physical blocks. The plane 0 and the plane 1 include peripheral circuits independent from each other (e.g., a row decoder, a column decoder, a page buffer, and a data cache) and can simultaneously perform erasing, writing, and reading by using a plane double speed mode. In this manner, each memory chip of the NAND 10D can perform a parallel operation by a plurality of channels, a bank interleave operation by a plurality of banks, and a parallel operation by using a plurality of planes. Each memory chip may be divided into four planes or may be configured without being divided.

In this manner, in the NAND 10D, a parallel operation by a plurality of channels, a parallel operation by a plurality of banks, and a parallel operation by a double speed mode using a plurality of planes can be performed. When the number of channels is 4, the number of banks is 4, and the number of planes is 2, up to 32 physical blocks can be operated in parallel.

The RAM 20D functions as a storage area as a write buffer 25D for temporarily storing data when the data from the host 1D is written to the NAND 10D, a storage area for storing and updating management information, such as an address translation table 21D and a logical block management table 22D, a work area, for example, for temporarily storing data read from the NAND 10D, and the like. The management information, such as the address translation table 21D and the logical block management table 22D, is obtained by loading the nonvolatile management table 12D stored in the NAND 10D at the time of activation or the like.

When the host 1D performs reading or writing on the SSD 100D, the host 1D inputs an LBA (Logical Block Addressing) as a logical address to the SSD 100D via the host interface 2D. An LBA is a logical address in which serial numbers starting from zero are attached to sectors (size: for example, 512 B). In the present embodiment, as a unit for managing data in the write buffer 25D and the NAND 10D, a management unit referred to as a cluster, which is larger than the sector size and smaller than the physical block size, is defined. In this embodiment, one type of management unit referred to as cluster is used, however, it is possible to add another management unit that is larger than the cluster size and is equal to or smaller than the physical block size and use two types of management unit.

In the SSD 100D, as a unit for collectively managing a plurality of physical blocks, a virtual block referred to as a logical block is defined. In this embodiment, a logical block is formed by combining physical block in such a way that a channel parallel operation, a bank interleave, and a plane double speed operation can be performed. In other words, a logical block is composed of physical blocks the number of which is determined by the number of channels×the number of banks×the number of planes. As shown in FIG. 30, if the number of channels is 4, the number of planes is 2, and the number of banks is 4, a logical block is composed of up to 32 physical blocks. A logical block may be composed of only physical blocks for a plurality of channels, only physical blocks for a plurality of banks, or only physical blocks for a plurality of planes. Moreover, physical blocks may be combined in such a way that a channel parallel operation and a bank interleave can be performed, physical blocks may be combined in such a way that a channel parallel operation and a plane double speed operation can be performed, or physical blocks may be combined in such a way that a bank interleave and a plane double speed operation can be performed.

As shown in FIG. 31, in the address translation table 21D managed in the RAM 20D, the correspondence between a cluster address of an LBA and cluster information is registered. A cluster address is obtained by dividing an LBA by the cluster size. The cluster information includes a storage location in the NAND 10D at which cluster data is stored (logical block number and intra-logical-block storage location at which cluster data is stored) and a cluster valid/invalid flag indicating whether the cluster is valid or invalid.

As shown in FIG. 32, in the logical block management table 22D managed in the RAM 20D, the correspondence relationship between the logical block number, the numbers of a plurality of physical blocks configuring a logical block (in this embodiment, up to 32 physical blocks), defective block information, used/unused information, and management information identification flag that identifies whether a logical block is for management information or user data is registered. The defective block information, for example, includes a defect flag Fk identifying whether 32 physical blocks are all present, that is, whether there is a defective physical block, defective block identification information Ik indicating the defective physical block number, and number-of-configuring-blocks information Nk indicating the number of physical blocks configuring a logical block. The number-of-configuring-blocks information Nk may be number-of-defective-blocks information indicating the number of defective physical blocks in a logical block. As described above, a defective physical block is a bad block BB that cannot be used as a storage area due to a large number of errors or the like and a bad block BB can be identified by the defective block identification information Ik. A bad block includes a congenital bad block generated in the manufacturing stage and an acquired bad block that becomes a bad block when a user uses the SSD.

The used/unused information identifies whether each logical block is in use, that is, whether each logical block is a free block FB or an active block AB. A free block FB is an unused block which does not include valid data therein and to which a use is not allocated. An active block AB is a used block which includes valid data therein and to which a use is allocated. With the use of the used/unused information, a free block FB used when writing is performed on the NAND 10D is selected. A free block FB includes both a block on which writing has never been performed and a block on which writing is performed once and in which all the written data thereafter becomes invalid data. Erasing is performed on a free block FB at a predetermined timing before the free block FB is used as an active block AB.

The management information identification flag is information that identifies whether a logical block is used for management information or for storing user data. A fixed number of logical blocks for storing management information for the necessary maximum capacity may be reserved in advance or the number of logical blocks for storing management information may be increased or decreased according to the progress of rewriting of the NAND 10D.

In this manner, logical blocks include a full logical block in which all the physical blocks are fully present and a defective logical block in which a defective physical block is present.

In this embodiment, when the power is turned on for the first time in the manufacturing stage, the controller 30D performs the construction processing of a logical block by using physical blocks excluding unusable blocks and registers the construction result in the logical block management table 22D. Unusable blocks include an initial (congenital) bad block, a fixed management area (physical block in which firmware for allowing to function as the controller 30D is stored), a reserved block (physical block reserved for management information when the power is turned on for the first time), and the like, and information indicating the unusable block number is, for example, registered in a static partition block in advance. A logical block constructed in the manufacturing stage is continuously used without change also when a user thereafter uses the SSD 100D. However, if an acquired bad block is generated when a user thereafter uses the SSD 100D, the defective block information in the logical block management table 22D are updated according to the occurrence status.

An allowable value (for example, two or four) may be set for the number of defective physical blocks and a logical block that includes defective physical blocks the number of which exceeds the allowable value may be set unusable. In such a case, when a plurality of unusable logical blocks that include defective physical blocks the number of which exceeds the allowable value is generated, the capacity of usable logical blocks decreases, therefore, the number of usable logical blocks may be increased by reconstructing a logical block by using a plurality of unusable logical blocks.

In the SSD 100D, a logical-physical dynamic translation method is used in which the relationship between a logical address (LBA) and a physical address (storage location in the NAND 10D) is not statically predetermined and a logical address and a physical address are dynamically associated with each other when data writing is performed. For example, when data is overwritten in the same LBA, the following processing is performed. Assume that valid data of the block size is stored in a logical address A1 and a block B1 is used as a storage area. When a command to overwrite update data of the block size in the logical address A1 is received from the host 1D, one free block FB (referred to as a block B2) is reserved and the data received from the host 1D is written in the free block FB. Thereafter, the logical address A1 is associated with the block B2. Consequently, the block B2 becomes an active block AB and the data stored in the block B1 becomes invalid, therefore, the block B1 becomes a free block FB.

In FIG. 29, the NANDC 31D includes a NAND I/F that performs interface processing with the NAND 10D, an error correction circuit, a DMA controller, and the like and writes data temporarily stored in the RAM 20D to the NAND 10D and reads and transfers data stored in the NAND 10D to the RAM 20D.

In FIG. 29, the controller 30D includes a read/write control unit 32D, a block managing unit 33D, an organizing unit 34D, a number-of-free-blocks checking unit (number-of-FBs checking unit) 35D, a number-of-clusters checking unit 36D, and a failure determining unit 37D.

The read/write control unit 32D performs processing of writing data to be written in the NAND 10D to the NAND 10D via a work area of the write buffer 25D of the RAM 20D or the RAM 20D and read processing from the NAND 10D. Moreover, the read/write control unit 32D performs update processing of the management table, such as the address translation table 21D and the logical block management table 22D, with the write operation to the NAND 10D.

The block managing unit 33D performs the construction processing of a logical block described above when the power is turned on for the first time in the manufacturing stage and updates the defective block information (defect flag Fk+defective block identification information Ik+number-of-configuring-blocks information Nk) in the logical block management table 22D with the subsequent generation of an acquired bad block.

The organizing unit 34D performs data organizing (compaction) in the NAND 10D. In the SSD 100D, when a data erasing unit (block) is different from a data management unit, according to the progress of rewriting of the NAND 10D, blocks are made porous due to invalid (non-latest) data. When blocks in such a porous state increase, substantially usable blocks decrease and a storage area of the NAND 10D cannot be effectively used. Therefore, for example, when the number of free blocks of the NAND 10D becomes less than a predetermined threshold, the NAND 10D is organized, for example, by performing the compaction of collecting valid data in logical blocks and rewriting them in a different block, thereby reserving a free block to which a use is not allocated. The organizing unit 34D performs updating processing on the management table, such as the address translation table 21D and the logical block management table 22D, with the execution of the compaction.

The number-of-free-blocks checking unit (number-of-FBs checking unit) 35D obtains the number of free blocks Nfb by counting the number of unused logical blocks on the basis of the used/unused information in the logical block management table 22D and outputs the obtained number of free blocks to the failure determining unit 37D.

The number-of-clusters checking unit 36D calculates the total number Ntotal of usable physical blocks by summing the number-of-configuring-blocks information Nk in the logical block management table 22D for all the logical blocks. The number of clusters Nclstr storable in one physical block is uniquely determined, therefore, the number-of-clusters checking unit 36D calculates the number of usable clusters Ntc by calculating Ntotal×Nclstr. The number-of-clusters checking unit 36D outputs the obtained total number of clusters Ntc to the failure determining unit 37D.

The failure determining unit 37D compares the number of free blocks Nfb input from the number-of-FBs checking unit 35D with a threshold Fref and outputs a failure detection signal when the number of free blocks Nfb is lower than the threshold Fref. Moreover, the failure determining unit 37D compares the total number of clusters Ntc input from the number-of-clusters checking unit 36D with a threshold Cref and outputs a failure detection signal when the number of clusters Ntc is lower than the threshold Cref.

Figure 33:
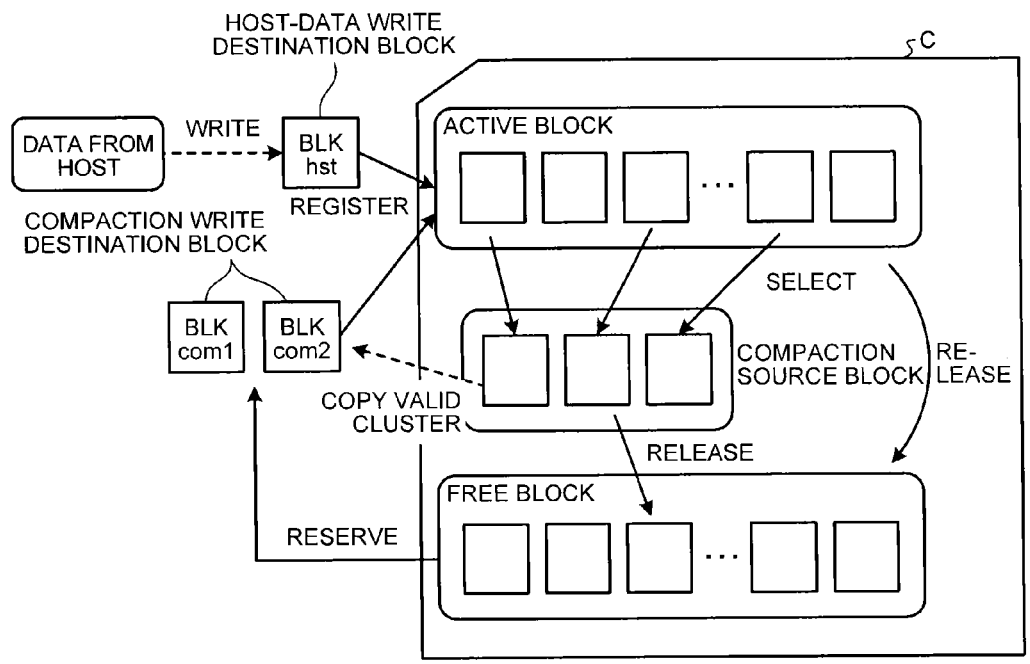
FIG. 33 is a diagram conceptually illustrating block management.

FIG. 33 is a diagram conceptually illustrating block management in the SSD 100D. In the NAND 10D, a logical block BLKhst for writing user data from the host 1D and logical blocks BLKcom1 and BLKcom2 for writing data in the compaction are always reserved. The logical block BLKcom1 is a write destination block in the compaction and the logical block BLKcom2 is a spare block for writing data that could not be written when the logical block BLKcom1 is a defective block. A block to which valid data is written by write processing of data from the host 10 or the compaction processing is managed as an active block AB. According to the progress of rewriting of the NAND 10D, an active block AB is released as a free block FB or released as a free block FB after becoming a write source block in the compaction. The free block FB is thereafter used as the logical block BLKhst for writing user data from the host 10 or the logical block BLKcom1 or BLKcom2 for writing data in the compaction.

Figure 34:
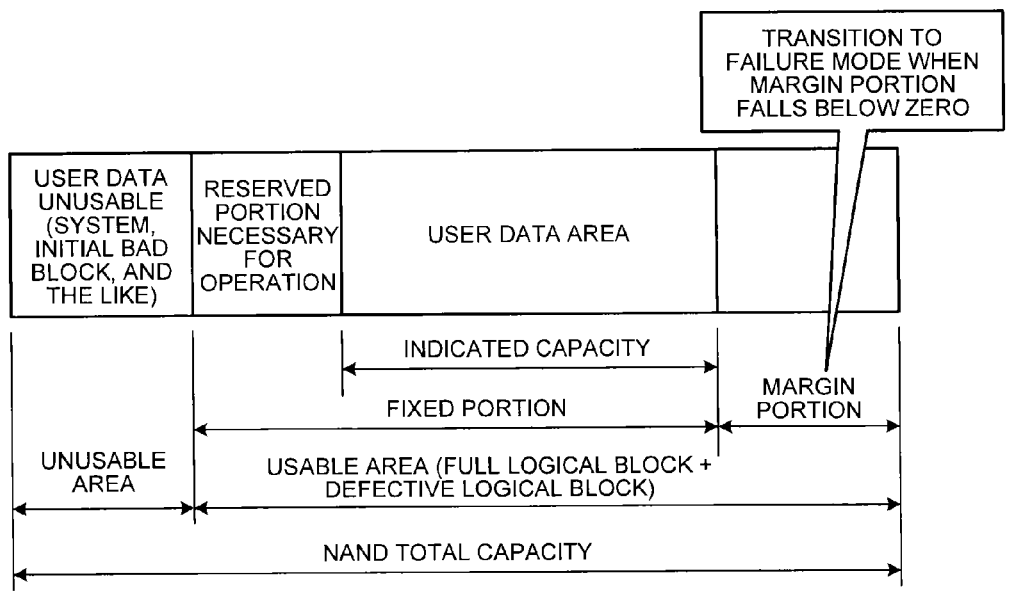
FIG. 34 is a diagram illustrating a breakdown of a total capacity of a NAND.

FIG. 34 illustrates the breakdown of the total capacity of the NAND 10D. The NAND total capacity is composed of an unusable area and a usable area (usable capacity). As described above, the unusable area includes an initial bad block, a fixed management area, a static partition block, and the like. The usable capacity is a total capacity of logical blocks that can be constructed and includes a full logical block and a defective logical block. The usable area includes a reserved portion necessary for an operation, a user data area for the indicated capacity, and a margin portion, and the write performance improves as the capacity of the margin portion is large.

In FIG. 34, as shown in FIG. 33, the reserved portion necessary for an operation includes the logical block BLKhst for writing user data from the host 1D, the logical blocks BLKcom1 and BLKcom2 for writing data in the compaction, the capacity for storing the management information, such as the address translation table 21D and the logical block management table 22D, and the like. In FIG. 34, when the user data area for the indicated capacity cannot be reserved, in other words, when the capacity of the margin portion falls below zero, the SSD enters a failure mode. In other words, when an acquired bad block is generated, the usable capacity decreases, and, when the capacity obtained by subtracting the reserved portion necessary for an operation from the usable capacity falls below the indicated capacity, the SSD enters a failure mode. The area surrounded by a symbol C in FIG. 33 becomes a target area for calculating the usable capacity.

Next, a failure determination by block depletion in the NAND 10D will be explained. When a bad block is acquired in the NAND 10D, the number of blocks usable for recording user data and the like decreases. In the present embodiment, when any of the following conditions is satisfied, it is determined that a block is depleted.

A. Condition in which the number of free blocks is insufficient and therefore next writing cannot be performed.

B. Condition in which the capacity for the margin portion cannot be reserved even if the compaction is performed.

The condition in which the number of free blocks is insufficient and therefore next writing cannot be performed is a condition in which the number of free blocks is insufficient and therefore the logical blocks BLKhst, BLKcom1, and BLKcom2 in FIG. 33 cannot be reserved. Thus, when the number of free blocks Nfb becomes lower than the threshold Fref, it is determined that the block depletion condition A is satisfied. The threshold Fref is the number of free blocks for the reserved portion necessary for an operation explained in FIG. 34 and a margin may be added to the number of free blocks.

In other words, for continuing to operate the SSD 100D, the logical blocks BLKhst, BLKcom1, and BLKcom2 are needed. Therefore, when the number of free blocks Nfb decreases, the compaction processing is performed to generate a free block. When the number of free blocks Nfb is about to fall below the total number (three) of the logical blocks BLKhst, BLKcom1, and BLKcom2, the compaction is essential processing. Generally, when the compaction processing is normally operated, the number of free blocks Nfb does not become less than three. However, in a state where the number of free blocks has decreased, if an error occurs and a bad block is generated during data copy processing in the compaction, data write processing from the host 1D, or the like, an alternative logical block needs to be reserved, therefore, the logical blocks BLKhst, BLKcom1, and BLKcom2 cannot be reserved. Thus, the block depletion condition A is satisfied and the compaction processing itself cannot be performed.

The condition in which the margin capacity cannot be reserved even if the compaction is performed is a condition in which the capacity for the margin portion becomes zero even if the compaction is performed multiple times and the user data area for the indicated capacity cannot be reserved. Therefore, when the number of usable clusters Ntc falls below the threshold Cref, it is determined that the block depletion condition B is satisfied. The threshold Cref is the number of clusters corresponding to the indicated capacity and the threshold Cref may be determined by adding a margin to the number of clusters. However, when the number of usable clusters Ntc is counted, the reserved portion necessary for an operation explained in FIG. 34 is excluded from the counted number of usable clusters Ntc.

Figure 35:
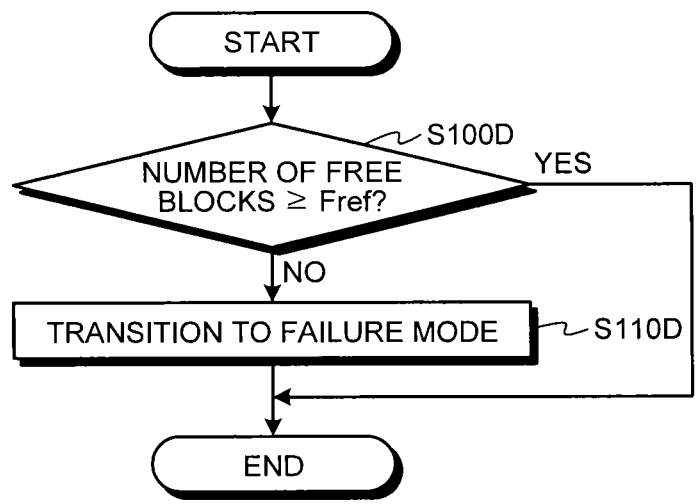
FIG. 35 is a flowchart illustrating a procedure of determining block depletion.

Next, a failure determination procedure for the block depletion condition A performed by the failure determining unit 37D will be explained with reference to FIG. 35. The number-of-FBs checking unit 35D obtains the number of free blocks Nfb at an appropriate timing (for example, when writing is performed on the NAND 10D, when an acquired bad block is generated and the logical block management table 22D is updated, while the NAND organizing is performed or when the NAND organizing is finished, or regularly) by counting the number of unused logical blocks on the basis of the used/unused information in the logical block management table 22D and outputs the obtained number of free blocks to the failure determining unit 37D.

When the number of free blocks Nfb is input from the number-of-FBs checking unit 35D, the failure determining unit 37D compares the number of free blocks Nfb with the threshold Fref (Step S1000). When the number of free blocks Nfb is smaller than the threshold Fref, the failure determining unit 37D outputs a failure detection signal to stop the operation of the SSD 100D or stop recording of user data, thereby causing the SSD 100D to transition to a failure mode (Step S110D). When the number of free blocks Nfb is equal to or larger than the threshold Fref, the failure determining unit 37D does not cause the SSD 100D to transition to the failure mode. As described above, the threshold Fref corresponds to the total number of the logical block BLKhst for writing user data from the host 1D, and the logical blocks BLKcom1 and BLKcom2 for writing data in the compaction.

Figure 36:
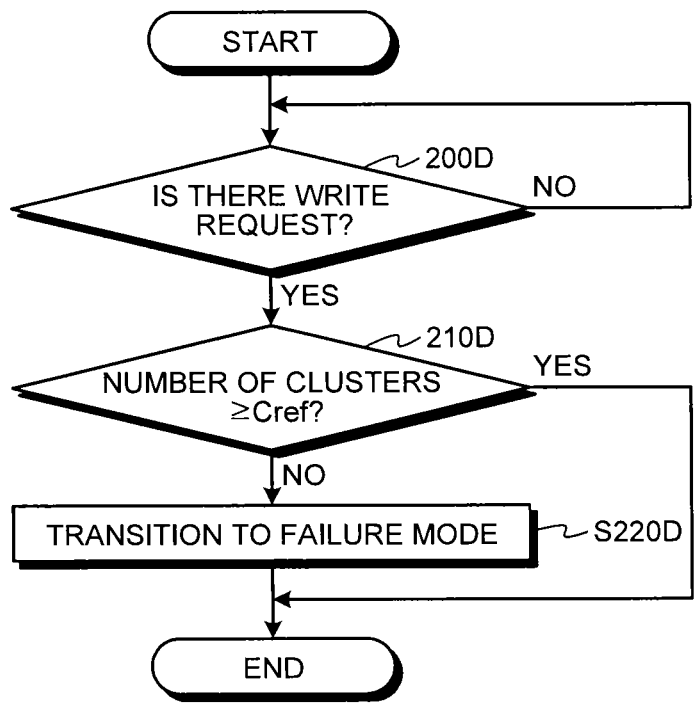
FIG. 36 is a flowchart illustrating a procedure of determining block depletion.

Next, a failure determination procedure for the block depletion condition B performed by the failure determining unit 37D will be explained with reference to FIG. 36. When a write request is issued from the host 1D (Step S200D), the number-of-clusters checking unit 36D calculates the number of usable clusters Ntc. The number of clusters Ntc is calculated as follows. The number-of-clusters checking unit 36D calculates the provisional total number of usable physical blocks Ntotal' by summing the number-of-configuring-blocks information Nk in the logical block management table 22D for all the logical blocks, and excludes (subtracts) the number of physical blocks corresponding to the reserved portion necessary for an operation shown in FIG. 34 from the provisional total number of physical blocks Ntotal', thereby calculating a subtraction result as the total number of usable physical blocks Ntotal.

The reserved portion necessary for an operation shown in FIG. 34 is the number of physical blocks corresponding to the logical blocks BLKhst, BLKcom1, and BLKcom2 shown in FIG. 33 and the number of physical blocks corresponding to the capacity for storing the management information, such as the address translation table 21D and the logical block management table 22D. The number of physical blocks corresponding to the logical blocks BLKhst, BLKcom1, and BLKcom2 is calculated as a preset fixed value (for example, three). When a logical block for the management information is fixedly managed, the number of physical blocks corresponding to the capacity for storing the management information, such as the address translation table 21D and the logical block management table 22D, is calculated as a preset fixed value. Moreover, when a logical block for the management information is variably managed, the number of physical blocks in which the management information is stored is derived by selecting logical blocks registered such that the management information is input in a column of the management information identification flag in the logical block management table 22D and summing the number-of-configuring-blocks information Nk of the selected logical blocks.

The number-of-clusters checking unit 36D calculates the total number of usable clusters Ntc (=Ntotal×Nclstr) by multiplying the derived total number of usable physical blocks Ntotal by the number of clusters Nclstr storable in one physical block. The number-of-clusters checking unit 36D outputs the obtained total number of clusters Ntc to the failure determining unit 37D.

When the total number of clusters Ntc is input from the number-of-clusters checking unit 36D, the failure determining unit 37D compares the total number of clusters Ntc with the threshold Cref (Step S210D). When the number of clusters Ntc is smaller than the threshold Cref, in a similar manner to the above, the failure determining unit 37D outputs a failure detection signal to stop the operation of the SSD 100D or stop recording of user data, thereby causing the SSD 100D to transition to the failure mode (Step S220D). When the number of clusters Ntc is equal to or larger than the threshold Cref, the failure determining unit 37D does not cause the SSD 100D to transition to the failure mode. As described above, the threshold Cref is the number of clusters corresponding to the indicated capacity.

If the number of clusters Ntc is calculated from the beginning each time the determination is made, a long calculation time is required, therefore, it is also possible to obtain an initial value of the number of clusters Ntc at the time of the above-described logical block construction when the power is turned on for the first time in the manufacturing stage and thereafter sequentially increase and decrease the initial value differentially when an event, such as reconstruction of a logical block and updating of the logical block management table 22D due to generation of a bad block, occurs, thereby efficiently calculating the number of clusters Ntc.

In this manner, in the sixth embodiment, it is determined whether the storage area for the indicated capacity can be reserved by performing the determination based on the number of clusters in addition to the determination based on the number of free blocks. Thus, even with the number-of-blocks variable system, depletion of blocks can be correctly determined and therefore the operation of the SSD can be continued to the limit.

In the above, the SSD 100D is stopped in the failure mode, however, the host 10 may be warned in advance. Specifically, a threshold obtained by adding a margin for a few logical blocks to each of the determination threshold Fref of the number of free blocks and the determination threshold Cref of the number of clusters is prepared, and, when the above-described block depletion condition A or B is satisfied by using the threshold, information indicating that the life is approaching is presented to the host 10 as statistical information or SMART information.

Moreover, in the above embodiment, when the block depletion condition B is determined, the number of clusters is used, however, it is possible to determine the block depletion condition B by using, for example, the number of physical blocks, the number of physical pages, or a different management unit larger than a cluster as long as it is larger than the sector size and is smaller than the logical block size.

Seventh Embodiment

Figure 37:
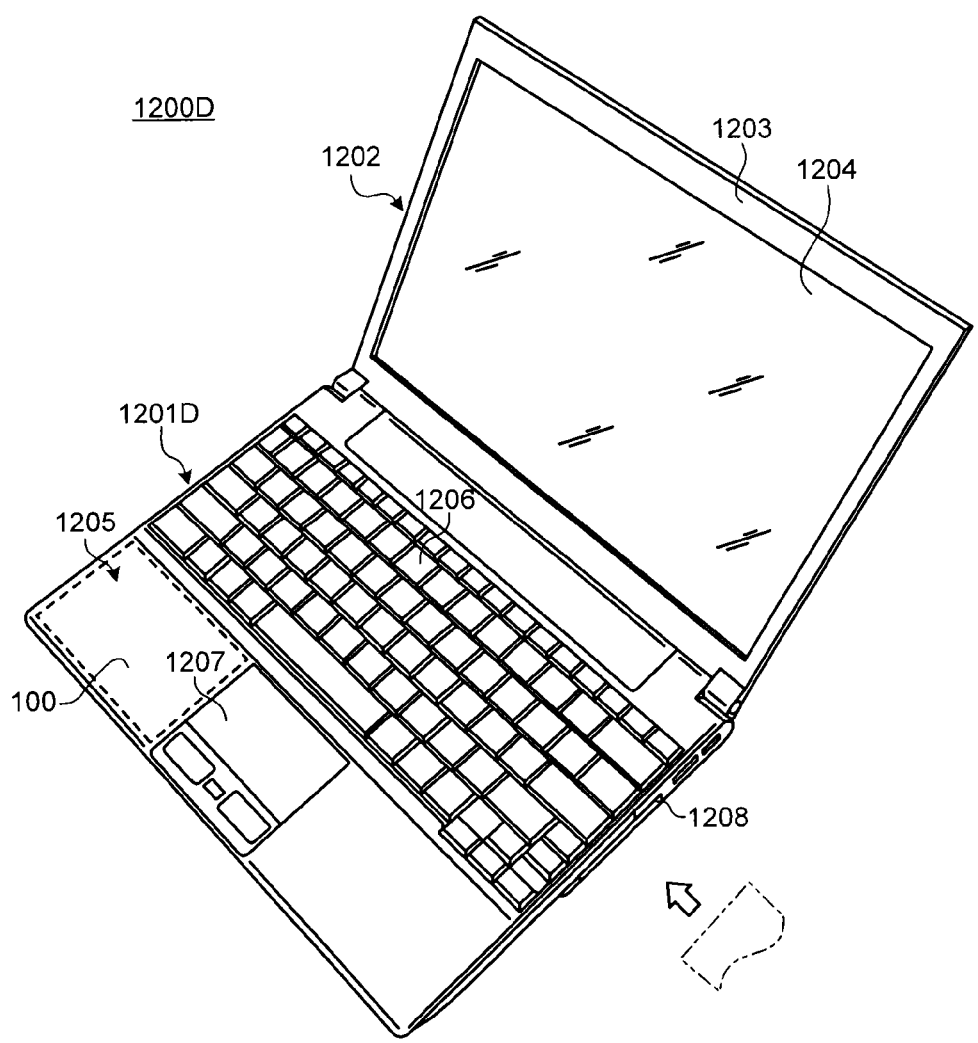
FIG. 37 is a perspective view illustrating an appearance of a personal computer according to the sixth embodiment.

FIG. 37 is a perspective view illustrating an example of a personal computer 1200D on which an SSD 100 (100A, 100B, 100C, or 100D) is mounted. The personal computer 1200D includes a main body 1201D and a display unit 1202. The display unit 1202 includes a display housing 1203 and a display device 1204 accommodated in the display housing 1203.

The main body 1201D includes a chassis 1205, a keyboard 1206, and a touch pad 1207 as a pointing device. The chassis 1205 accommodates therein a main circuit board, an ODD (Optical Disk Device) unit, a card slot, the SSD 100, and the like.

The card slot is provided so as to be adjacent to the peripheral wall of the chassis 1205. The peripheral wall has an opening 1208 facing the card slot. A user can insert and remove an additional device into and from the card slot from outside the chassis 1205 through the opening 1208.

The SSD 100 may be used instead of a conventional HDD (Hard Disk Drive) in a state of being mounted on the personal computer 1200D or may be used as an additional device in a state of being inserted into the card slot included in the personal computer 1200D.

Figure 38:
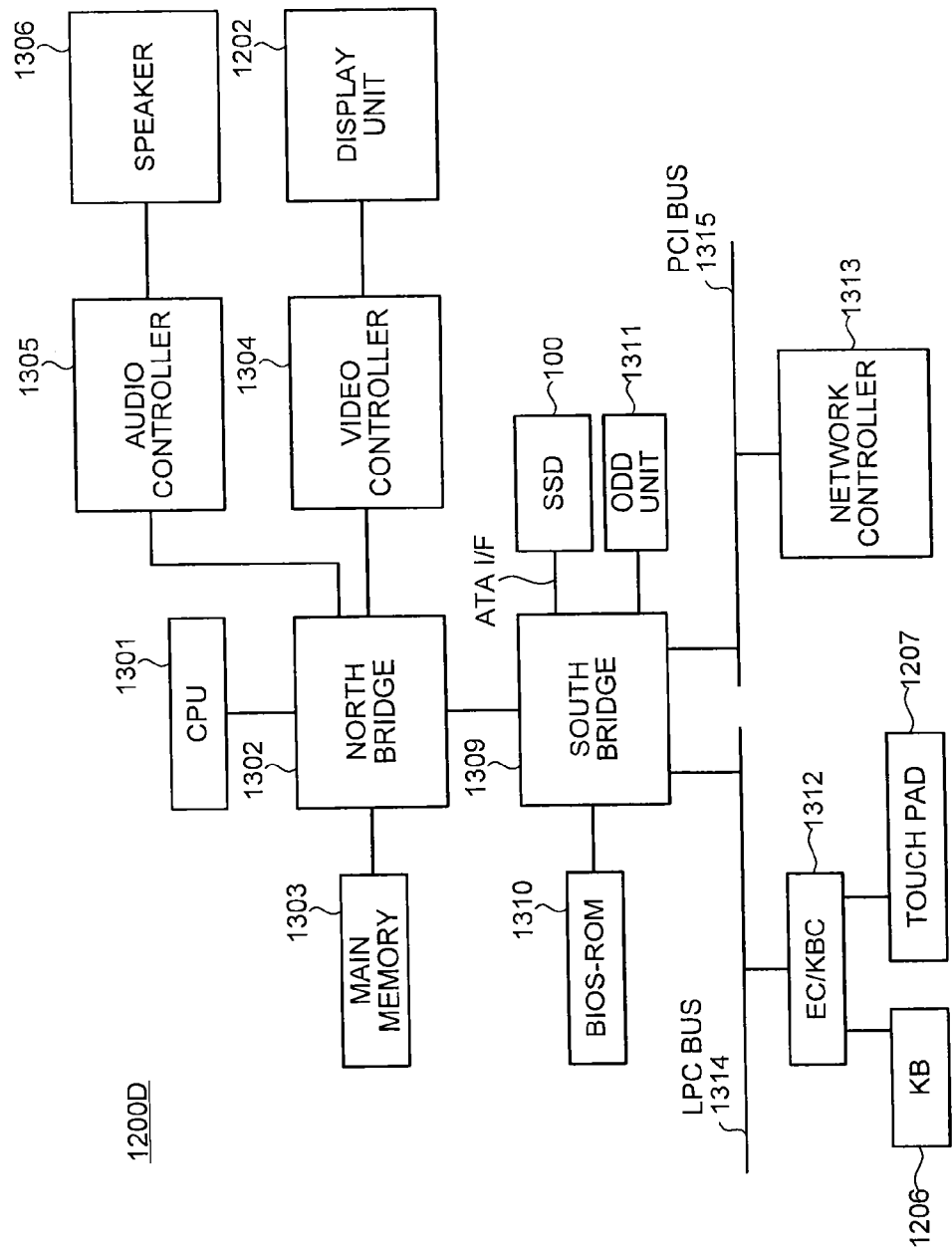
FIG. 38 is a diagram illustrating a system configuration example of the personal computer according to the sixth embodiment.

FIG. 38 illustrates a system configuration example of the personal computer on which the SSD is mounted. The personal computer 1200D includes a CPU 1301, a north bridge 1302, a main memory 1303, a video controller 1304, an audio controller 1305, a south bridge 1309, a BIOS (Basic Input Output System)-ROM 1310, the SSD 100, an ODD unit 1311, an embedded controller/keyboard controller IC (EC/KBC) (Integrated Circuit) 1312, a network controller 1313, and the like.

The CPU 1301 is a processor provided for controlling an operation of the personal computer 1200D, and executes an operating system (OS) loaded from the SSD 100 onto the main memory 1303. Furthermore, when the ODD unit 1311 is capable of executing at least one of read processing and write processing on a mounted optical disk, the CPU 1301 executes the processing.

Moreover, the CPU 1301 executes a system BIOS (Basic Input Output System) stored in the BIOS-ROM 1310. The system BIOS is a program for controlling hardware in the personal computer 1200D.

The north bridge 1302 is a bridge device that connects a local bus of the CPU 1301 to the south bridge 1309. The north bridge 1302 has a memory controller for controlling an access to the main memory 1303.

Moreover, the north bridge 1302 has a function of executing a communication with the video controller 1304 and a communication with the audio controller 1305 via an AGP (Accelerated Graphics Port) bus or the like.

The main memory 1303 temporarily stores therein a program and data, and functions as a work area of the CPU 1301. The main memory 1303, for example, consists of a RAM.

The video controller 1304 is a video reproduction controller for controlling the display unit 1202 used as a display monitor of the personal computer 1200D.

The audio controller 1305 is an audio reproduction controller for controlling a speaker 1306 of the personal computer 1200D.

The south bridge 1309 controls each device on a LPC (Low Pin Count) bus 1314 and each device on a PCI (Peripheral Component Interconnect) bus 1315. Moreover, the south bridge 1309 controls the SSD 100 that is a memory device storing various software and data via the ATA interface.

The personal computer 1200D accesses the SSD 100 in sector units. A write command, a read command, a cache flush command, and the like are input to the SSD 100 via the ATA interface.

The south bridge 1309 has a function of controlling an access to the BIOS-ROM 1310 and the ODD unit 1311.

The EC/KBC 1312 is a one-chip microcomputer in which an embedded controller for power management and a keyboard controller for controlling the keyboard (KB) 1206 and the touch pad 1207 are integrated.

The EC/KBC 1312 has a function of turning on/off the power of the personal computer 1200D according to an operation of a power button by a user. The network controller 1313 is, for example, a communication device that executes communication with an external network, such as the Internet.

As an information processing apparatus on which the SSD 100 is mounted, an imaging device, such as a still camera and a video camera, may be used. Such an information processing apparatus can improve random read and random write performances by mounting the SSD 100. Accordingly, convenience of a user who uses the information processing apparatus can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a nonvolatile semiconductor memory configured to include a plurality of physical blocks, the physical blocks being units of data erasing; and
a controller configured associate the physical blocks with a logical block, the controller being configured to manage the physical blocks, wherein
the controller includes:
a block managing unit configured to manage, when a bad block is generated among the physical blocks, the logical block as a defective logical block, the defective logical block being associated with a plurality of physical blocks other than the bad block;
a first calculating unit configured to count a number of free blocks, the free blocks being unused logical blocks in the nonvolatile semiconductor memory;
a second calculating unit configured to convert a capacity of a logical block in the nonvolatile semiconductor memory into a first management size, the first management size being a size equal to or smaller than a size of a physical block, the first management size being a size larger than a size of a sector, the second calculating unit being configured to calculate a number of pieces of usable data of the first management size; and
a failure determining unit configured to determine that a failure has occurred, the failure determining unit being configured to change a mode to a failure mode, when at least one of a first condition and a second condition is satisfied, the first condition being a condition in which the counted number of free blocks is less than a first threshold, the second condition being a condition in which the calculated number of pieces of data of the first management size is less than a second threshold.

2. The semiconductor memory device according to claim 1, wherein the second threshold corresponds to an indicated capacity of the semiconductor memory device.

3. The semiconductor memory device according to claim 1, further comprising:
a write control unit configured to perform a write operation on the nonvolatile semiconductor memory; and
an organizing unit configured to collect valid data in a logical block, the organizing unit being configured to rewrite the valid data in a free block, wherein,
when a capacity of a logical block to be converted into the first management size is derived, the second calculating unit totals the capacity of the logical block by excluding a free block to which data from a host is to be written next, and by excluding a free block that is a write destination to be written to by the organizing unit.

4. The semiconductor memory device according to claim 3, wherein the first threshold corresponds to a number obtained by adding a number of free blocks to which data from the host is to be written next, to a number of free blocks that are write destinations to be written to by the organizing unit.

5. The semiconductor memory device according to claim 1, wherein the first management size is a unit for managing write data to the nonvolatile semiconductor memory.

6. A management information generating method comprising:
performing a first group generating processing including generating a physical block address group by extracting physical block addresses in first predetermined quantities in ascending order of address values, the physical block addresses being addresses in a nonvolatile memory, the nonvolatile memory being arranged in a semiconductor memory device, the semiconductor memory device being used as an external memory device of a computer system;
performing, when a physical block address of a bad block is included in the physical block address group, a second group generating processing including generating a next physical block address group, the next physical block address group being generated by setting a physical block address of a first good block following the bad block, as a top physical block address of the next physical block address group;
performing a first bad block setting processing on each of the physical block addresses in the physical block address group, including setting all of the physical block addresses following a first bad block, as a bad block;
performing a group set generating processing including generating a physical block address group set, by extracting, from all of the physical block address groups, the physical block address groups in second predetermined quantities in descending order from the physical block address group that has a largest number of good blocks to the physical block address group that has a smallest number of good blocks;
performing a second bad block setting processing on each physical block address group of each of generated physical block address group sets, including setting a bad block to each of the physical block address groups, so that a number of consecutive bad blocks and number a of consecutive good blocks from a top in each physical block address group become a same value as a number of consecutive bad blocks and a number of consecutive good blocks from a top in a physical block address group that has a smallest number of good blocks in the physical block address group set; and
performing a table generating processing including generating an address management table in which a logical block address group and the physical block address group set are associated with each other, the logical block address group being a plurality of consecutive logical block addresses, the plurality of consecutive logical block addresses being set by using a logical block address in the nonvolatile memory the logical block address corresponding to a logical address specified by a host device.

7. The management information generating method according to claim 6, further comprising:
performing a validity setting processing including generating a validity management table in which validity information is set for the logical block addresses, the validity management table being generated based on whether the physical block address is a good block, the validity information indicating whether each logical block address in the logical block address group is a good block;
performing a third group generating processing including generating the physical block address group by using a physical block address that is set to a bad block in the second bad block setting processing; and
performing, on the physical block address group generated in the third group generating processing, the second group generating processing, the first bad block setting processing, the group set generating processing, the second bad block setting processing, and the table generating processing.

8. The management information generating method according to claim 6, further comprising:
performing a validity setting processing including generating a validity management table in which validity information is set for the logical block addresses, the validity management table being generated based on whether the physical block address is a good block, the validity information indicating whether each logical block address in the logical block address group is a good block;
performing a third group generating processing including generating the physical block address group by using a physical block address set as a bad block in the second bad block setting processing; and
repeating, on the physical block address group generated in the third group generating processing, the second group generating processing, the first bad block setting processing, the group set generating processing, the second bad block setting processing, the table generating processing, the validity setting processing, and the third group generating processing.

9. The management information generating method according to claim 8, wherein the third group generating processing includes, when a plurality of good blocks is present in the physical block address group, dividing the physical block address group into a plurality of physical block address groups, and distributing the good blocks to each of the physical block address groups.

10. The management information generating method according to claim 9, wherein the second group generating processing, the first bad block setting processing, the group set generating processing, the second bad block setting processing, the table generating processing, the validity setting processing, and the third group generating processing are repeated until the physical block address group sets are generated by using all of the physical block address groups.

11. A logical block constructing method comprising:
performing a first processing including constructing a usable first logical block based on unusable block information, the unusable block information indicating an unusable physical block, the usable first logical block including a first number of physical blocks that corresponds to a maximum parallelism;
performing a second processing including constructing, from a physical block other than the physical blocks included in the first logical block, a usable second logical block, the usable second logical block being constructed based on the unusable block information, the usable second logical block including a second number of physical blocks, the second number of physical blocks being obtained by subtracting, from the first number of physical blocks, a predetermined number of physical blocks, the predetermined number of physical blocks being one or more, the usable second logical block being a logical block in which a physical block to that is lacking for the first logical block, is managed as a defective physical block; and
performing construction of a logical block by allowing a shortage in a number of physical blocks, up to and including the predetermined number, wherein
the first processing, the second processing, and the construction are performed on a semiconductor memory device, the semiconductor memory device including a nonvolatile semiconductor memory, the nonvolatile semiconductor memory including a plurality of physical blocks, the physical blocks being units of data erasing, the nonvolatile semiconductor memory including a plurality of parallel operation elements, the parallel operation elements being set units of physical blocks capable of a parallel operation.

12. The logical block constructing method according to claim 11, further comprising:
performing a third processing based on the unusable block information, including constructing, from a physical block other than the physical blocks included in the first logical block and in the second logical block, an unusable third logical block, the unusable third logical block including a third number of physical blocks, the third number of physical blocks being obtained by subtracting, from the second number of physical blocks, a predetermined number of physical blocks, the predetermined number of physical blocks being one or more, the predetermined number of physical blocks being a physical block that is lacking for the first logical block, is managed as a defective physical block; and
constructing a plurality of second logical blocks by using physical blocks included in the third logical block and physical blocks included in the first logical block.

13. The logical block constructing method according to claim 12, wherein the first processing, the second processing, and the third processing are performed when the semiconductor memory device is activated a first time.

14. The logical block constructing method according to claim 12, wherein, when the semiconductor memory device is used, the first logical block or the second logical block is constructed by combining physical blocks included in a plurality of third logical blocks.

15. The logical block constructing method according to claim 12, wherein, when the semiconductor memory device is used, the first logical block or the second logical block is constructed by combining physical blocks included in the third logical block and a physical block that does not belong to any of the first logical block, the second logical block, and the third logical block.

16. A logical block constructing method comprising:
performing a first processing including selecting a predetermined number of physical blocks that store system data; and
performing a second processing including constructing a logical block that stores user data by using a physical block other than the physical blocks selected by the first processing, wherein
the first processing includes preferentially selecting, based on unusable block information indicating an unusable physical block, a physical block included in a parallel operation element including a larger number of usable physical blocks, as a physical block that stores system data, so that, after selection, a number of usable physical blocks among a plurality of parallel operation elements is balanced, wherein
the first processing and the second processing are performed on a memory system, the memory system including a nonvolatile semiconductor memory, the nonvolatile semiconductor memory including a plurality of memory chips, the memory chips including a plurality of physical blocks, the physical blocks being units of data erasing, the nonvolatile semiconductor memory including a plurality of parallel operation elements, the parallel operation elements being set units of physical blocks capable of a parallel operation.

17. The logical block constructing method according to claim 16, wherein
the first processing includes:
dividing the parallel operation elements into a plurality of groups;
preferentially selecting for each of the divided groups, based on the unusable block information, a physical block included in a parallel operation element including a larger number of usable physical blocks, as a physical block that stores system data, so that, after selection, at number of usable physical blocks among the parallel operation elements is balanced; and
multiplexing system data by constructing, for each group, a physical block that stores system data.

18. The logical block constructing method according to claim 16, wherein the first processing includes selecting, from a central position portion of a memory chip, a physical block that stores system data.

19. The logical block constructing method according to claim 16, wherein
the parallel operation elements include channels, banks, and planes,
wherein
the second processing includes selecting physical blocks one by one from the channels, the banks, and the planes, and associating selected physical blocks with a logical block,
the first processing includes:
classifying a plurality of physical blocks included in the nonvolatile semiconductor memory into a plurality of classification units, each of the classification units being a plurality of physical blocks that is included in a same channel, a same bank, and a same plane; and
preferentially selecting, based on the unusable block information, a physical block included in a classification unit including a larger number of usable physical blocks, as a physical block that stores system data, so that, after selection, a number of usable physical blocks among the classification units is balanced.

20. The logical block constructing method according to claim 16, wherein
the parallel operation elements include channels, banks, and planes,
wherein
the nonvolatile semiconductor memory includes a plurality of channels, the channels including a plurality of memory chips, each of the memory chips being divided into a plurality of planes, each of the planes including a plurality of physical blocks, the memory chips in each of the channels are divided into a plurality of banks across the plurality of channels, wherein
the first processing includes:
classifying a plurality of physical blocks included in the nonvolatile semiconductor memory into a plurality of classification units, each of the classification units being a plurality of physical blocks that is included in a same channel, a same bank, a same memory chip, and a same plane; and
preferentially selecting, based on the unusable block information, a physical block included in a classification unit including a larger number of usable physical blocks, as a physical block that stores system data, so that, after selection, a number of usable physical blocks among the classification units is balanced, wherein
the second processing includes selecting, from each of the classification units, one physical block, and associating the selected physical blocks with a logical block.

* * * * *